(12) United States Patent
Ishikawa et al.

(10) Patent No.: US 6,479,095 B1
(45) Date of Patent: Nov. 12, 2002

(54) COMPOSITE MATERIAL FOR HEAT SINKS FOR SEMICONDUCTOR DEVICES AND METHOD FOR PRODUCING THE SAME

(75) Inventors: Shuhei Ishikawa, Handa (JP); Tsutomu Mitsui, Aichi-Pref (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/614,899

(22) Filed: Jul. 12, 2000

Related U.S. Application Data

(62) Division of application No. 09/022,687, filed on Feb. 12, 1998, now Pat. No. 6,110,577.

(30) Foreign Application Priority Data

Feb. 14, 1997 (JP) .............................. 9-030698
May 16, 1997 (JP) .............................. 9-127540
Dec. 26, 1997 (JP) .............................. 9-359101

(51) Int. Cl.[7] .............................. B05D 3/02; B05D 1/18; B05D 1/36; B05D 5/00
(52) U.S. Cl. ................. 427/123; 427/124; 427/294; 427/295; 427/370; 427/398.1; 427/398.4; 427/398.5; 427/404; 427/405; 427/431; 164/75
(58) Field of Search .................. 427/294, 295, 427/370, 398.1, 398.4, 398.5, 404, 405, 374.4, 431, 123, 124; 164/75, 97

(56) References Cited

U.S. PATENT DOCUMENTS

| | | | |
|---|---|---|---|
| 3,837,848 A | | 9/1974 | Wessel |
| 5,298,283 A | * | 3/1994 | Rocazella et al. ........... 427/181 |
| 5,322,109 A | | 6/1994 | Cornie |
| 5,410,796 A | * | 5/1995 | Weeks, Jr. ................. 29/419.1 |
| 5,437,921 A | | 8/1995 | Kogo et al. |
| 5,526,867 A | | 6/1996 | Keck et al. |
| 5,533,257 A | * | 7/1996 | Romero et al. .......... 29/890.03 |
| 5,553,658 A | * | 9/1996 | Cornie ........................ 164/97 |
| 5,570,502 A | | 11/1996 | Sawtell et al. |
| 5,689,796 A | | 11/1997 | Kasai et al. |
| 5,905,938 A | | 5/1999 | Akiyoshi |

FOREIGN PATENT DOCUMENTS

| | | |
|---|---|---|
| DE | 35 35 081 A1 | 4/1987 |
| DE | 41 00 145 A1 | 7/1991 |
| JP | 77008329 B * | 3/1977 |
| JP | 55-127044 A | 10/1980 |
| JP | 58059544 A * | 4/1983 |
| JP | 59-228742 | 12/1984 |
| JP | 6-145840 A * | 5/1994 |
| JP | 8-279569 | 10/1996 |
| WO | 95/17297 | 10/1992 |
| WO | 95/15919 | 6/1995 |
| WO | 95/27127 | 10/1995 |
| WO | WO 96/41030 | 12/1996 |

* cited by examiner

Primary Examiner—Michael Barr
(74) Attorney, Agent, or Firm—Burr & Brown

(57) ABSTRACT

A high-pressure vessel is allowed to be in an initial state, and a first chamber is disposed downward. Copper or copper alloy is placed in the first chamber, and SiC is set in a second chamber. The high-pressure vessel is tightly sealed, and then the inside of the high-pressure vessel is subjected to vacuum suction through a suction pipe. An electric power is applied to a heater to heat and melt the copper or copper alloy in the first chamber. At a stage at which the molten copper in the first chamber arrives at a predetermined temperature, the high-pressure vessel is inverted by 180 degrees to give a state in which SiC is immersed in the molten copper. An impregnating gas is introduced into the high-pressure vessel through a gas inlet pipe to apply a pressure to the inside of the high-pressure vessel. Thus, SiC is impregnated with the molten copper. The high-pressure vessel is inverted by 180 degrees, and then the impregnating gas in the high-pressure vessel is discharged through a gas outlet pipe, simultaneously with which a cooling gas is introduced into the high-pressure vessel through the gas inlet pipe to cool the high-pressure vessel.

20 Claims, 16 Drawing Sheets

FIG. 3

| EXAMPLE | IMPREGNATING MATERIAL | POROSITY VOL% | PORE DIAMETER μm | DISTRIBUTION FROM 5 TO 50 μm | THERMAL CONDUCTIVITY W/mk | THERMAL EXPANSION ×10$^{-6}$/°C | POROUS BODY |
|---|---|---|---|---|---|---|---|
| EXAMPLE 1 | COPPER | 30.9 | 46.4 | 90 | 222 | 4.56 | SiC |
| EXAMPLE 2 | COPPER | 27.5 | 20.2 | 97 | 212 | 4.19 | SiC |
| EXAMPLE 3 | COPPER | 24.0 | 14.8 | 97 | 193 | 4.49 | SiC |
| EXAMPLE 4 | COPPER | 39.4 | 38.5 | 92 | 245 | 5.9 | SiC |
| EXAMPLE 5 | COPPER | 39.7 | 24.2 | 97 | 246 | 6.2 | SiC |
| EXAMPLE 6 | COPPER | 49.1 | 28.0 | 93 | 268 | 6.8 | SiC |
| EXAMPLE 7 | COPPER | 62 | 6.5 | 99 | 298 | 7.5 | SiC |
| EXAMPLE 8 | COPPER | 63 | 37 | 92 | 299 | 8.8 | SiC |
| EXAMPLE 9 | COPPER, Be 0.5wt% | 30.9 | 10.1 | 99 | 220 | 4.19 | SiC |
| COMPARATIVE EXAMPLE 1 | COPPER | 14 | 25 | 98 | 165 | 4.0 | SiC |
| COMPARATIVE EXAMPLE 2 | COPPER | 80 | 40 | 88 | 325 | 12.4 | SiC |
| COMPARATIVE EXAMPLE 3 | COPPER | 50 | 150 | 75 | 261 | 9.1 | SiC |

COEFFICIENT OF THERMAL EXPANSION: AVERAGE FROM ROOM TEMPERATURE TO 200°C

FIG. 7

| NO. | POROSITY % | PORE DIAMETER μm | Ni PLATING | Si IMPREGNATION | IMPREGNATION TEMPERATURE | APPLIED PRESSURE kgf/cm² | PRESSURE-APPLYING TIME min | COOLING TEMPERATURE °C/min | REACTION SITUATION OF SiC/Cu | IMPREGNATION SITUATION |
|---|---|---|---|---|---|---|---|---|---|---|
| SAMPLE 1 | 35 | 70 | ABSENT | ABSENT | 1130 | 8 | 60 | 260 | △ | △ |
| SAMPLE 2 | 44 | 22 | ABSENT | ABSENT | 1130 | 80 | 20 | 900 | ○ | ◎ |
| SAMPLE 3 | 59 | 42 | ABSENT | PRESENT | 1130 | 120 | 10 | 480 | ◎ | ◎ |
| SAMPLE 4 | 15 | 5 | PRESENT | ABSENT | 1130 | 240 | 10 | 900 | ◎ | ○ |
| SAMPLE 5 | 59 | 42 | ABSENT | PRESENT | 1180 | 8 | 60 | 900 | △ | △ |
| SAMPLE 6 | 15 | 5 | ABSENT | ABSENT | 1180 | 40 | 20 | 480 | ○ | △ |
| SAMPLE 7 | 59 | 42 | ABSENT | PRESENT | 1180 | 120 | 10 | 900 | ◎ | ◎ |
| SAMPLE 8 | 44 | 22 | ABSENT | ABSENT | 1180 | 240 | 10 | 620 | ◎ | ◎ |
| SAMPLE 9 | 44 | 22 | ABSENT | PRESENT | 1230 | 8 | 20 | 480 | ○ | △ |
| SAMPLE 10 | 59 | 42 | PRESENT | ABSENT | 1230 | 40 | 35 | 790 | ○ | ○ |
| SAMPLE 11 | 35 | 70 | PRESENT | ABSENT | 1230 | 80 | 10 | 620 | ◎ | ◎ |
| SAMPLE 12 | 44 | 22 | ABSENT | PRESENT | 1230 | 240 | 5 | 620 | ◎ | ◎ |
| SAMPLE 13 | 59 | 42 | ABSENT | ABSENT | 1280 | 40 | 5 | 620 | ○ | ○ |
| SAMPLE 14 | 35 | 70 | ABSENT | ABSENT | 1280 | 80 | 35 | 790 | △ | ◎ |
| SAMPLE 15 | 44 | 22 | PRESENT | ABSENT | 1280 | 80 | 5 | 480 | ○ | ◎ |
| SAMPLE 16 | 59 | 42 | ABSENT | PRESENT | 1280 | 120 | 10 | 790 | ○ | ◎ |

NOTE  REACTION OF SiC/Cu : ○NO REACTION   ◎GOOD IMPREGNATION   △MUCH REACTION
IMPREGNATION STATE OF Cu : ○LESS REACTION   ◎FAIRLY INSUFFICIENT IMPREGNATION   △INSUFFICIENT IMPREGNATION

COMPOSITE MATERIAL FOR HEAT SINKS FOR SEMICONDUCTOR DEVICES AND METHOD FOR PRODUCING THE SAME

CROSS REFERENCE TO RELATED APPLICATION

This is a divisional application of U.S. Ser. No. 09/022,687, filed Feb. 12, 1998, now U.S. Pat. No. 6,110,577, the entirety of which is incorporated herein by reference.

BACKGROUND OF THE INVENTION

1. Field of the Invention

The present invention relates to a composite material and a method for producing the same, the composite material being used for heat sinks for semiconductor devices, for constructing a heat sink for a semiconductor device for efficiently releasing heat generated from the semiconductor device.

2. Description of the Related Art

In general, heat is a dangerous enemy of semiconductor devices. Therefore, it is necessary that the internal temperature of the semiconductor device does not exceed a maximum allowable temperature for retaining the joining or connecting structure. Semiconductor devices such as power transistors and semiconductor rectifying elements consume a large amount of electric power per unit of operation area. Therefore, it is impossible to release a sufficient amount of the generated heat only by relying on an amount of heat released through a case (package) and lead wires of the semiconductor device. In such a circumstance, there is a fear that the internal temperature of the device is raised, and any thermal destruction would occur.

This phenomenon also occurs in the same manner in semiconductor devices which carry a CPU. The amount of heat generation during operation is increased in proportion to the improvement in clock frequency. As a result, it is an important factor to make a thermal design in consideration of heat release.

In the thermal design in consideration of avoidance of the thermal destruction or the like, element designs and mounting designs are made taking account of a heat sink having a large heat release area which is securely attached to a case (package) of the semiconductor device.

In general, those used as the material for the heat sink include metal materials such as copper and aluminum having good thermal conductivity.

Recently, in semiconductor devices such as CPUs and memories, it is intended to drive the device with low electric power in order to decrease electric power consumption, while the semiconductor device itself tends to have a large size in proportion to highly densified element integration and enlargement of element formation area. When the semiconductor device has a large size, the stress, which is generated due to the difference in thermal expansion between the semiconductor substrate (silicon substrate or GaAs substrate) and the heat sink, is increased. As a result, there is a likelihood of delamination, and and mechanical destruction of the semiconductor device.

In order to avoid such inconveniences, the conceivable countermeasure includes realization of low electric power operation of the semiconductor device and improvement of the material for heat sinks. At present, in relation to the low electric power operation of the semiconductor device, a device, which is operated at a power source voltage of a level of not more than 3.3 V, is practically used, beyond those operated at the TTL level (5 V) having been hitherto used.

On the other hand, in relation to the constitutive material for the heat sink, it is insufficient to consider only the thermal conductivity. Besides, it is necessary to select a material having high thermal conductivity with a coefficient of thermal expansion which is approximately coincident with those of silicon and GaAs to be used for the semiconductor substrate.

A variety of reports have been submitted in relation to the improvement in material for the heat sink. For example, there is a case based on the use of aluminum nitride (AlN) and a case based on the use of Cu (copper)-W (tungsten). AlN is excellent in balance between the thermal conductivity and the thermal expansion, and it especially has a coefficient of thermal expansion which is approximately coincident with that of Si. Therefore, AlN is preferred as a material for heat sinks for the semiconductor device based on the use of a silicon substrate as the semiconductor substrate.

On the other hand, Cu—W is a composite material which possesses both the low thermal expansion of W and the high heat conductivity of Cu, and it easily processed by means of machining. Therefore, Cu—W is preferred as a constitutive material for heat sinks having complicated shapes.

There are other suggested cases including, for example, a material obtained by containing metallic Cu in a ratio of 20 to 40% by volume in a ceramic base material comprising a major component of SiC (Conventional Example 1: see Japanese Laid-Open Patent Publication No. 8-279569), and a material obtained by impregnating a powdery sintered porous body comprising inorganic substances with Cu in an amount of 5 to 30% by weight (Conventional Example 2: see Japanese Laid-Open Patent Publication No. 59-228742).

The material for heat sinks concerning Conventional Example 1 is based on powder shaping in which a green compact comprising SiC and metallic Cu is shaped to prepare a heat sink. Therefore, the coefficient of thermal expansion and the coefficient of thermal conductivity thereof are persistently represented by theoretical values. In this case, there is a problem that it is impossible to obtain the balance between the coefficient of thermal expansion and the coefficient of thermal conductivity demanded for actual electronic parts or the like.

In Conventional Example 2, the ratio of Cu, with which the powdery sintered porous body comprising inorganic substances is impregnated, is low. Therefore, there is a fear that a limit appears when it is intended to increase the thermal conductivity.

SUMMARY OF THE INVENTION

The present invention has been made taking such problems into consideration, an object of which is to provide a composite material for heat sinks for semiconductor devices, which makes it possible to obtain characteristics adapted to balance the coefficient of thermal expansion and the coefficient of thermal conductivity demanded for actual electronic parts or the like (including semiconductor devices).

Another object of the present invention is to provide a method for producing a composite material for heat sinks for semiconductor devices, which makes it possible to easily perform a treatment for impregnating a porous sintered compact with a metal although such a treatment is generally considered to be difficult, making it possible to improve the rate of impregnation of the metal into the porous sintered compact, and making it possible to improve the productivity of the heat sink which has characteristics adapted to balance the coefficient of thermal expansion and the coefficient of thermal conductivity demanded for actual electronic parts or the like (including semiconductor devices).

At first, explanation will be made for the optimum characteristics as the material for heat sinks. The required coefficient of thermal expansion is preferably in a range of $4.0 \times 10^{-6}/°C$ to $9.0 \times 10^{-6}/°C$ as an average coefficient of thermal expansion from room temperature to 200° C., because it is necessary to conform to the coefficient of thermal expansion of the ceramic substrate such as those composed of AlN and the semiconductor substrate such as those composed Si and GaAs. The required coefficient of thermal conductivity is preferably not less than 180 W/mK (room temperature), because it is necessary to satisfy the requirement equivalent or superior to those satisfied by the presently used Cu—W material.

According to the present invention, there is provided a composite material for heat sinks for semiconductor devices, comprising a porous sintered compact impregnated with copper or a copper alloy, the porous sintered compact being obtained by pre-calcinating a porous body having a coefficient of thermal expansion which is lower than a coefficient of thermal expansion of copper so that a network structure is formed; wherein the composite material has a characteristic that at least a coefficient of thermal expansion at 200° C. is lower than a coefficient of thermal expansion which is stoichiometrically obtained on the basis of a ratio between the copper or the copper alloy and the porous sintered compact.

According to the present invention, it is possible to suppress the expansion to be at a value which is lower than the thermal expansion (theoretical value) determined by the ratio between the porous sintered compact and the copper or the copper alloy with which the porous sintered compact is impregnated. The coefficient of thermal expansion is approximately coincident with those of, for example, ceramic substrates and semiconductor substrates (silicon, GaAs). Thus, it is possible to obtain a material for heat sinks having good thermal conductivity.

Specifically, it is possible to obtain a material for heat sinks in which an average coefficient of thermal expansion in a range from room temperature to 200° C. is $4.0 \times 10^{-6}/°C$ to $9.0 \times 10^{-6}/°C$, and a coefficient of thermal conductivity is not less than 180 W/mK (room temperature).

It is desirable that the porous sintered compact comprises at least one or more compounds selected from the group consisting of SiC, AlN, $Si_3N_4$, $B_4C$, and BeO. It is desirable that the ratio (impregnation rate) of the copper or the copper alloy is 20% by volume to 70% by volume. If the rate of impregnation of copper is less than 20% by volume, it is impossible to obtain the coefficient of thermal expansion of 180 W/mK (room temperature), while if the rate of impregnation exceeds 70% by volume, then the strength of the porous sintered compact (especially SiC) is lowered, and it is impossible to suppress the coefficient of thermal expansion to be less than $9.0 \times 10^{-6}/°C$.

It is desirable that a value of an average open pore diameter of the porous sintered compact is 0.5 to 50 μm. If the value of the average open pore diameter is less than 0.5 μm, then it is difficult to impregnate the open pores with the metal, and the coefficient of thermal conductivity is lowered. On the other hand, if the value of the average open pore diameter exceeds 50 μm, then the strength of the porous sintered compact is lowered, and it is impossible to suppress the coefficient of thermal expansion to be low.

It is preferable that the distribution (pore distribution) in relation to the average open pore of the porous sintered compact is distributed by not less than 90% in a range of 0.5 to 50 μm. If the pores of 0.5 to 50 μm are not distributed by not less than 90%, the open pores, which are not impregnated with copper, are increased. Consequently, the coefficient of thermal conductivity is decreased, or the strength is decreased, and it is impossible to suppress the coefficient of thermal expansion to be low.

It is desirable that bending strength of the porous sintered compact is not less than 10 MPa. If the strength is less than this value, then it is impossible to suppress the coefficient of thermal expansion to be low, and it is impossible to obtain the composite material having the coefficient of thermal expansion in the predetermined range.

In general, when commercially available pure copper is used as the copper, a good composite material having a high coefficient of thermal conductivity is obtained. However, the obtained composite material is not excellent in wettability with respect to the porous sintered compact (especially SiC), and the open pores which are not impregnated with copper tend to remain. Therefore, it is desirable to improve the impregnation rate by adding, for example, Be, Al, Si, Mg, Ti, and Ni. However, if the additive is added in an amount of not less than 1%, then the coefficient of thermal conductivity is greatly decreased, and it is impossible to obtain the effect which would be otherwise obtained by the addition.

It is desirable that a reaction layer, which is formed at an interface between the porous sintered compact and the copper (only copper or one containing copper and Be, Al, Si, Mg, Ti, Ni or the like in a range up to 1%), is not more than 5 μm. More preferably, the reaction layer is not more than 1 μm. If the reaction layer is thicker than 5 μm, then the heat transfer between the porous sintered compact and the copper is deteriorated, and the thermal conduction of the composite material for heat sinks for semiconductor devices is decreased.

In another aspect, the present invention provides a method for producing a composite material for heat sinks for semiconductor devices, the method comprising an impregnating step of heating a porous sintered compact to serve as a base material and a metal containing at least copper, in a state of making no contact with each other, and making contact of the both at a stage of arrival at a predetermined temperature to immediately apply a high pressure so that the porous sintered compact is impregnated with the metal; and a cooling step of cooling the porous sintered compact impregnated with at least the metal.

For example, the porous sintered compact to serve as the base material and the copper or the copper alloy used for impregnation thereof are heated while making no contact with each other. At the stage at which both arrive at a temperature not less than a melting point of the copper or the copper alloy, both are allowed to make contact with each other to immediately apply the high pressure so that the porous sintered compact is impregnated with the copper or the copper alloy, followed by quick cooling.

Accordingly, the treatment for impregnating the porous sintered compact with the copper or the copper alloy, which is generally considered to be difficult, can be performed with ease. Moreover, it is possible to improve the rate of impregnation of the copper or the copper alloy into the porous sintered compact. As a result, it is possible to improve the productivity of the heat sink which has characteristics adapted to balance the coefficient of thermal expansion and the coefficient of thermal conductivity demanded for actual electronic parts or the like (including semiconductor devices).

The characteristics adapted to balance the coefficient of thermal expansion and the coefficient of thermal conductivity demanded for actual electronic parts or the like (including semiconductor devices) are represented such that the average coefficient of thermal expansion from room temperature to 200° C. is $4.0 \times 10^{-6}$/° C. to $9.0 \times 10^{-6}$/° C., and the coefficient of thermal conductivity is not less than 180 W/mK (room temperature).

In a preferred embodiment, the impregnating step may comprise the steps of placing the porous sintered compact and the metal into an identical vessel, arranging the metal at a lower portion of the vessel, and then allowing the vessel to be in a negative pressure state or in an ordinary pressure state therein; heating and melting the metal to convert the metal into molten metal; inverting the vessel at a stage at which the molten metal arrives at a predetermined temperature to immerse the porous sintered compact in the molten metal in the vessel; and impregnating the porous sintered compact with the molten metal by introducing an impregnating gas into the vessel to apply a pressure in the vessel.

That is, the porous sintered compact and the copper or the copper alloy to be used for impregnating the porous sintered compact therewith are placed in the vessel, and the vessel is tightly sealed to perform vacuum suction, followed by heating while placing the copper or the copper alloy at the lower portion of the vessel. The vessel is inverted by 180 degrees to be upside down at the stage at which the copper or the copper alloy is melted to arrive at the predetermined temperature. Accordingly, the copper or the copper alloy is allowed to make contact with the porous sintered compact. A high pressure is applied in the vessel so that the porous sintered compact is impregnated with the copper or the copper alloy.

In another preferred embodiment, the impregnating step may comprise the steps of placing the metal having been previously melted and the porous sintered compact into an identical vessel, arranging the molten metal at a lower portion of the vessel, and then allowing the vessel to be in a negative pressure state or in an ordinary pressure state therein; inverting the vessel at a stage at which the molten metal arrives at a predetermined temperature to immerse the porous sintered compact in the molten metal in the vessel; and impregnating the porous sintered compact with the molten metal by introducing an impregnating gas into the vessel to apply a pressure in the vessel.

That is, the previously melted copper or the copper alloy is placed into the vessel in which the porous sintered compact is installed, and the vessel is inverted by 180 degrees to be upside down at the stage at which the contents in the vessel arrive at the predetermined temperature. Accordingly, the copper or the copper alloy is allowed to make contact with the porous sintered compact. A high pressure is applied in the vessel so that the porous sintered compact is impregnated with the copper or the copper alloy.

The applied pressure is not less than 10 kgf/cm$^2$ and not more than 1000 kgf/cm$^2$, preferably not less than 50 kgf/cm$^2$ and not more than 200 kgf/cm$^2$, and more preferably not less than 100 kgf/cm$^2$ and not more than 150 kgf/cm$^2$.

In this embodiment, the pressure is applied for a period of time of not less than 1 minute and not more than 30 minutes, and desirably not less than 2 minutes and not more than 10 minutes.

The predetermined temperature is a temperature which is higher than a melting point of the copper or the copper alloy for impregnation therewith by 30° C. to 250° C., and preferably the predetermined temperature is a temperature which is higher than the melting point by 50° C. to 200° C. In this embodiment, it is preferable that the copper or the copper alloy for impregnating the porous sintered compact therewith is heated in vacuum of not more than $1 \times 10^{-3}$ Torr.

It is desirable that the porous sintered compact includes pores not less than 90% of which have an average diameter of 0.5 $\mu$m to 50 $\mu$m, having a porosity of 20% by volume to 70% by volume.

In a preferred embodiment, the porous sintered compact is previously plated with Ni in an amount of 1 to 10% by volume. In this embodiment, the wettability between the porous sintered compact and the copper or the copper alloy is improved, and it is possible to realize impregnation at a low pressure. The amount of the Ni plating is desirably 3 to 5% by volume. The Ni plating referred to herein includes, for example, Ni—P plating and Ni—B plating.

It is also preferable that the porous sintered compact is previously impregnated with 1 to 10% by volume of Si. In this embodiment, the wettability between the porous sintered compact and the copper or the copper alloy is improved in the same manner as the case of the application of Ni plating described above, and it is possible to realize impregnation at a low pressure. The amount of the impregnation of Si is desirably 3 to 5% by volume.

In relation to the Ni plating previously applied by 1 to 10% by volume to the porous sintered compact, or the previous impregnation of Si by 1 to 10% by volume, it is also preferable that the porous sintered compact is previously plated with palladium. In this embodiment, in addition to the palladium plating, it is also possible to apply composite plating together with Ni and Si.

In still another preferred embodiment, the cooling step may comprise the steps of inverting the vessel to separate the porous sintered compact after the impregnation from the remaining molten metal not subjected to the impregnation; and venting the impregnating gas from the vessel to quickly introduce a cooling gas so that the inside of the vessel is cooled. Alternatively, the cooling step may comprise the steps of inverting the vessel to separate the porous sintered compact after the impregnation from the remaining molten metal not subjected to the impregnation; and allowing the vessel to make contact with a chill block so that the inside of the vessel is cooled.

The cooling step is preferably performed at a cooling rate of not less than $-400°$ C./hour from the temperature during the impregnation to 800° C., and more preferably not less than $-800°$ C./hour.

The applied pressure is a pressure necessary to completely impregnate the open pores of the porous sintered compact with the copper or the copper alloy. In this process, if the open pores, which are not impregnated with the copper or the copper alloy, remain in the porous sintered compact, the heat conductivity is markedly inhibited. Therefore, it is necessary to apply a high pressure.

The pressure can be approximately estimated in accordance with the expression of Washburn. However, the smaller the pore diameter is, the larger the required force is. For example, the required pressure is 400 kgf/cm$^2$ in the case of 0.1 $\mu$m$\phi$, 40 kgf/cm$^2$ in the case of 1.0 $\mu$m$\phi$, and 4 kgf/cm$^2$ in the case of 10 $\mu$m$\phi$ respectively.

A reaction occurs between the porous sintered compact and the copper or the copper alloy in the molten state. For example, when SiC is used as the porous sintered compact, SiC is decomposed into Si and C, and the original function is not exhibited. For this reason, it is necessary to shorten the period of time during which SiC makes direct contact with Cu in the molten state. According to the production method concerning the present, it is possible to shorten the contact time between SiC and Cu. Accordingly, it is possible to avoid the decomposition reaction of SiC as described above beforehand.

The wettability is poor between SiC and the copper or the copper alloy. Therefore, it is necessary to apply the high pressure in order to sufficiently perform the impregnation with the copper or the copper alloy. According to the production method concerning the present invention, the pore surface of SiC is modified in quality to give good wettability between SiC and Cu. Accordingly, it is possible to impregnate finer pores with the copper or the copper alloy at a lower pressure.

In still another preferred embodiment, the impregnating step may comprise the steps of placing the porous sintered compact and the metal in a negative pressure state or in an ordinary pressure state while making no contact with each other; heating the porous sintered compact and the metal to the predetermined temperature at the negative pressure or at the ordinary pressure to melt the metal; allowing the molten metal to be in a pressure-applied state; and allowing the molten metal at the applied pressure to quickly make contact with the porous sintered compact at the negative pressure or at the ordinary pressure and allowing them to be in a pressure-applied state so that the porous sintered compact is impregnated with the molten metal at the applied pressure; and the cooling step may comprise the step of cooling the porous sintered compact impregnated with the molten metal at the applied pressure.

In this embodiment, the porous sintered compact and the metal are heated while performing sufficient deaeration to melt the metal, followed by making quick contact and giving the pressure-applied state. Further, the pressure-applied state is maintained until completion of the cooling operation. Thus, it is possible to efficiently impregnate the porous sintered compact with the molten metal.

In the production method as described above, it is preferable that both of the porous sintered compact and the molten metal, which are heated and treated while making no contact with each other at the negative pressure or at the ordinary pressure, are placed in the pressure-applied state, and then they are allowed to quickly make contact with each other so that the porous sintered compact is impregnated with the metal.

Accordingly, the porous sintered compact is allowed to be in the pressure-applied state together with the molten metal, followed by performing the contact and impregnating operations. Thus, it is possible to minimize the pressure drop which would be caused upon the contact of the both, and it is possible to well maintain the pressure-applied state during the impregnating operation.

In still another preferred embodiment, the impregnating step may comprise the steps of arranging the porous sintered compact and the metal respectively in upper and lower chambers of an identical vessel comparted to have the two chambers by a porous filter, and tightly sealing the vessel so that the respective chambers are in a negative pressure state or in an ordinary pressure state; heating both of the upper and lower chambers at the negative pressure or at the ordinary pressure to a predetermined temperature so that the metal is melted; allowing only the upper chamber to be in a pressure-applied state; and allowing the molten metal in the upper chamber at the applied pressure to permeate through the porous filter to the lower chamber so that the molten metal quickly makes contact with the porous sintered compact at the negative pressure or at the ordinary pressure, followed by allowing the lower chamber to be in a pressure-applied state so that the porous sintered compact at the applied pressure is impregnated with the molten metal; and the cooling step may comprise the step of cooling the porous sintered compact impregnated with the molten metal in the lower chamber in the pressure-applied state.

In this embodiment, the upper chamber arranged with the metal and the lower chamber arranged with the porous sintered compact can be independently subjected to pressure control by using the porous filter. Accordingly, it is possible to quickly reduce or apply the pressure by using a predetermined pressure control mechanism.

The porous sintered compact in the lower chamber can be deaerated while maintaining it in the negative pressure state or in the ordinary pressure state immediately before the impregnation of the molten metal. Further, the contact and impregnating operations for the molten metal and the porous sintered compact can be easily performed in accordance with the pressure control effected by the aid of the porous filter. In this process, the molten metal can be quickly treated with the filter, because of the difference in pressure which is provided beforehand between the both chambers.

The material for the porous filter is not specifically limited provided that the material has a porous property of a degree so that the molten metal makes no permeation at the ordinary pressure and the molten metal makes permeation at the applied pressure. Those preferably usable as the material include, for example, carbon cloth, punching metal composed of stainless steel, and alumina cloth.

In still another preferred embodiment, the impregnating step may comprise the steps of arranging the porous sintered compact and the metal respectively in upper and lower chambers of an identical vessel comparted to have the two chambers by a porous filter, and tightly sealing the vessel so that the respective chambers are in a negative pressure state or in an ordinary pressure state; heating both of the upper and lower chambers at the negative pressure or at the ordinary pressure to a predetermined temperature so that the metal is melted; allowing both of the upper and lower chambers to be in a pressure-applied state; and raising a pressure of the pressure-applied upper chamber to be higher than a pressure of the lower chamber, and allowing the molten metal to permeate through the porous filter to the lower chamber so that the molten metal quickly makes contact with the porous sintered compact, and then the porous sintered compact at the applied pressure is impregnated with the molten metal; and the cooling step may comprise the step of cooling the porous sintered compact impregnated with the molten metal in the lower chamber at the applied pressure.

In this embodiment, the porous sintered compact is allowed to be in the pressure-applied state together with the molten metal, followed by performing the contact and impregnating operations. Thus, it is possible to minimize the pressure drop which would be caused upon the contact of the both, and it is possible to well maintain the pressure-applied state during the impregnating operation.

In the present invention, when the porous sintered compact to serve as the base material is treated and impregnated with the metal containing at least copper, the step of providing the pressure-applied state may be performed by means of a press treatment effected in both upward and downward directions, and the cooling step may be performed by means of an indirect cooling treatment effected in the vicinity of the lower chamber.

According to the production method concerning the present invention, it is possible to more quickly perform the pressure control, and it is possible to well maintain the pressure-applied state during the impregnating operation.

In still another aspect, the present invention provides a method for producing a composite material for heat sinks for semiconductor devices, the method comprising an impregnating step of allowing a porous sintered compact to serve as a base material to make contact with a metal containing at least copper at a negative pressure or at an ordinary pressure, performing a heating treatment to melt the metal, and then quickly impregnating the porous sintered compact with the metal in a pressure-applied state; and a cooling step of cooling at least the porous sintered compact impregnated with the metal.

Accordingly, the treatment for impregnating the porous sintered compact with the copper or the copper alloy, which is generally considered to be difficult, can be performed with ease. Moreover, it is possible to improve the rate of impregnation of the copper or the copper alloy into the porous sintered compact. As a result, it is possible to improve the productivity of the heat sink which has characteristics adapted to the balance between the coefficient of thermal expansion and the coefficient of thermal conductivity demanded for actual electronic parts or the like (including semiconductor devices).

In a preferred embodiment, the impregnating step may comprise the steps of placing the porous sintered compact and the metal in a negative pressure state or in an ordinary pressure state while making contact with each other; heating the porous sintered compact and the metal to a predetermined temperature at the negative pressure or at the ordinary pressure to melt the metal; allowing the molten metal to be in a pressure-applied state; and allowing the molten metal at the applied pressure to quickly make contact with the porous sintered compact at the negative pressure or at the ordinary pressure and allowing them to be in a pressure-applied state so that the porous sintered compact is impregnated with the molten metal at the applied pressure; and the cooling step may comprise the step of cooling the porous sintered compact impregnated with the molten metal at the applied pressure.

As described above, according to the production method concerning the present invention, it is possible to suppress the expansion to be at a value which is lower than the thermal expansion amount (theoretical value) determined by the ratio between the porous sintered compact and the copper or the copper alloy with which the porous sintered compact is impregnated. The coefficient of thermal expansion is approximately coincident with those of, for example, the ceramic substrate and the semiconductor substrate (silicon, GaAs). Thus, it is possible to obtain the material for heat sinks having good thermal conductivity.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 3 shows a table illustrating the difference in coefficient of thermal conductivity and coefficient of thermal expansion obtained by appropriately changing the porosity, the pore diameter, and the pore distribution of sic.

FIG. 7 shows a table illustrating the difference in reaction situation of SiC/Cu and impregnation situation of Cu obtained by appropriately changing the porosity of SiC, the pore diameter, the presence or absence of Ni plating, the presence or absence of Si impregnation, the impregnation temperature, the applied pressure, the pressure-applying time, and the cooling rate.

DESCRIPTION OF THE PREFERRED EMBODIMENTS

Illustrative embodiments of the composite material for heat sinks for semiconductor devices and the method for producing the same according to the present invention (hereinafter simply referred to as "composite material according to the embodiment" and "production method according to the embodiment") will be explained below with reference to FIGS. 1 to 17.

Figure 1:
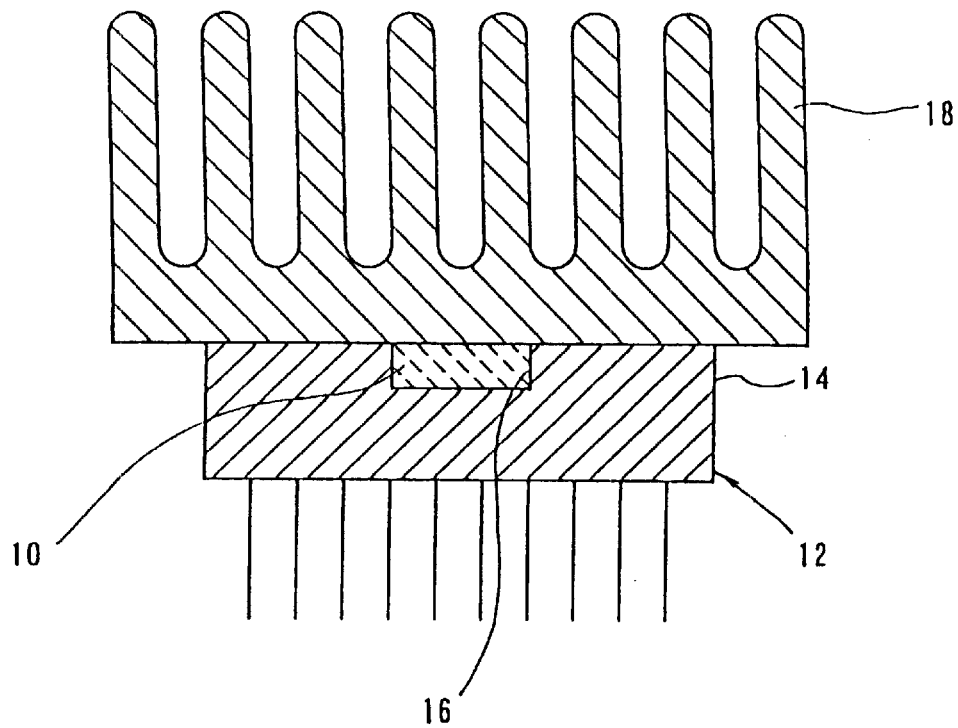
FIG. 1 illustrates an example of the use of a heat sink constructed by using a composite material prepared in accordance with an embodiment of the present invention.

At first, as shown in FIG. 1, the heat sink 10, which is constructed by the composite material according to the embodiment of the present invention, is embedded in an opening 16 formed in an upper surface of a package 14 of a semiconductor device 12. The heat sink 10 is installed such that its surface contacts with a cooling fin 18 secured to an upper section of the semiconductor device 12.

Accordingly, the heat, which is released from the semiconductor element (chip) mounted in the semiconductor device 12, is efficiently transmitted to the cooling fin 18 through the heat sink 10.

Figure 2:
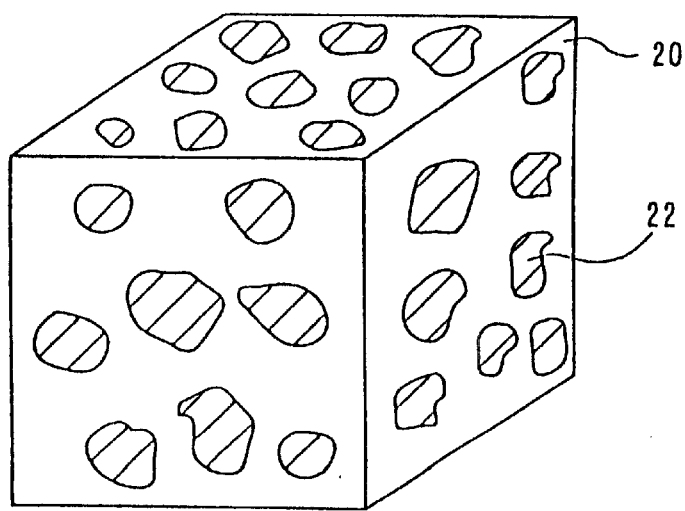
FIG. 2 shows a perspective view conceptually illustrating the structure of a composite material prepared in accordance with an embodiment of the present invention.

The composite material according to the embodiment of the present invention is constructed by impregnating, with copper or copper alloy, a porous sintered compact obtained by pre-calcinating a porous body having a coefficient of thermal expansion which is lower than the coefficient of thermal expansion of copper so that a network structure is formed. Specifically, for example, as shown in FIG. 2, the composite material is constructed such that open pores (open pore portions) of a porous sintered compact 20 composed of SiC are impregnated with the copper or copper alloy 22. In the following description, the porous sintered compact composed of SiC will be simply referred to as "SiC".

According to the construction described above, it is possible to suppress the expansion to have a value which is lower than the thermal expansion (theoretical value) determined by the ratio between SiC and the copper or copper alloy 22 for impregnating SiC therewith as described above later on. The coefficient of thermal expansion is approximately coincident with those of, for example, ceramic substrates and semiconductor substrates (silicon, GaAs) to be used as the substrate for electronic parts or the like. Thus, it is possible to obtain the material for heat sinks having good thermal conductivity. Specifically, it is possible to obtain the material for heat sinks in which the average coefficient of thermal expansion in a range from room temperature to 200° C. is $4.0 \times 10^{-6}$/° C. to $9.0 \times 10^{-6}$/° C., and the coefficient of thermal conductivity is not less than 180 W/mK (room temperature).

In the present invention, it is desirable that the porosity of SiC (approximately the same as the impregnation rate of the copper or copper alloy 22) is 20% by volume to 70% by volume. If the porosity is less than 20% by volume, it is impossible to obtain the coefficient of thermal expansion of 180 W/mK (room temperature). If the porosity exceeds 70% by volume, then the strength of SiC is lowered, and it is impossible to suppress the coefficient of thermal expansion to be less than $9.0 \times 10^{-6}$/° C.

It is desirable that the value of the average open pore diameter (pore diameter) of SiC is 0.5 to 50 $\mu$m. If the pore diameter is less than 0.5 $\mu$m, then it is difficult to impregnate the open pores with the copper or copper alloy 22, and the coefficient of thermal conductivity is lowered. On the other hand, if the pore diameter exceeds 50 $\mu$m, then the strength of SiC is lowered, and it is impossible to suppress the coefficient of thermal expansion to be low.

It is preferable that the distribution (pore distribution) in relation to the average open pores of SiC is distributed by not less than 90% in a range of 0.5 to 50 $\mu$m. If the pores of 0.5 to 50 $\mu$m are not distributed by not less than 90%, the open pores, which are not impregnated with the copper or copper alloy 22, are increased. Consequently, the coefficient of thermal conductivity is decreased.

The porosity, the pore diameter, and the pore distribution were measured by using an automatic porosimeter (trade name: Autopore 9200) produced by Simadzu Corporation.

It is preferable that bending strength of SiC is not less than 10 MPa, desirably not less than 20 MPa, and more desirably not less than 30 MPa, because of the following reason. That is, if the bending strength is lower than 10 MPa, a problem arises in that the coefficient of thermal expansion is increased.

In general, when commercially available pure copper is used as the copper, a good composite material having a high coefficient of thermal conductivity is obtained. However, the obtained composite material is not excellent in wettability with respect to the porous sintered compact (especially SiC), and the open pores which are not impregnated with copper tend to remain. Therefore, it is desirable to improve the impregnation rate by adding, for example, Be, Al, Si, Mg, Ti, and Ni. In this case, the component of copper may contain one or more species of Be, Al, Si, Mg, Ti, and Ni in a range up to 1%, further containing gas components and inevitable impurities such as Ag, Cd, Zn, Au, Pd, In, Ga, Pt, Cr, Ge, Rh, Sb, Ir, Co, As, Zr, Fe, Sn, Mn, P, and Pb. However, if the additive is added in an amount more than 1%, then the coefficient of thermal conductivity is greatly decreased, and it is impossible to obtain the effect which would be otherwise obtained by the addition.

An illustrative experiment will now be described. In this illustrative experiment, observation was made for the difference in coefficient of thermal conductivity and coefficient of thermal expansion when the porosity, the pore diameter, and the pore distribution of SiC were appropriately changed. Obtained experimental results are shown in a table in FIG. 3.

In FIG. 3, Examples 1 to 8 represent cases in which copper was used as the impregnating material, while changing the porosity, the pore diameter, and the pore distribution within the predetermined ranges respectively. Example 9 represents a case in which a copper alloy containing 0.5% by weight of Be and the balance of Cu was used as the impregnating material, while allowing the porosity, the pore diameter, and the pore distribution to be within the predetermined ranges respectively. Comparative Example 1 represents a case in which copper was used as the impregnating material, and the porosity was deviated from the predetermined range. Comparative Example 2 represents a case in which copper was used as the impregnating material, and the porosity and the pore distribution were deviated from the predetermined ranges respectively. Comparative Example 3 represents a case in which copper was used as the impregnating material, and the pore diameter and the pore distribution were deviated from the predetermined ranges respectively.

According to the experimental results, any one of Examples 1 to 9 satisfies the coefficient of thermal conductivity=180 W/mK (room temperature) or more, and the coefficient of thermal expansion=$4.0 \times 10^{-6}$/° C. to $9.0 \times 10^{-6}$/° C. The coefficient of thermal expansion is an average value of those obtained at room temperature to 200° C.

On the other hand, in Comparative Example 1, the porosity has a value lower than the predetermined range. Therefore, the impregnation rate of copper is lowered, in accordance with which the coefficient of thermal conductivity is 165 W/mK which is also low. In Comparative Example 2, the porosity has a value higher than the predetermined range. Therefore, the impregnation rate of copper is increased, and the coefficient of thermal conductivity is 325 W/mK which is also high. However, the strength of SiC is lowered in a degree corresponding thereto, and the coefficient of thermal expansion is $12.4 \times 10^{-6}$/° C. which is high.

Figure 4:
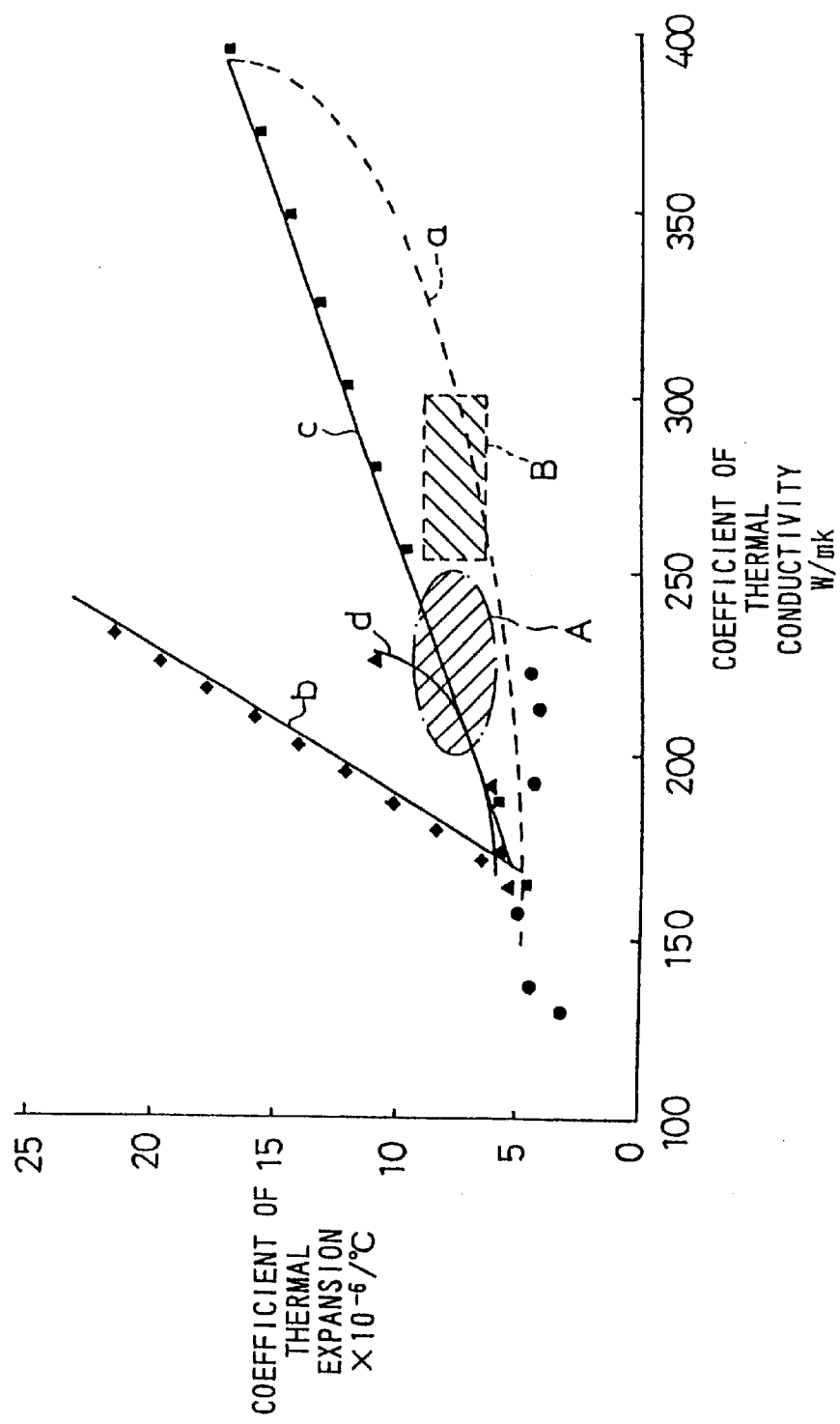
FIG. 4 shows characteristic curves illustrating the coefficient of thermal conductivity-coefficient of thermal expansion characteristic of various composite materials.
Figure 5:
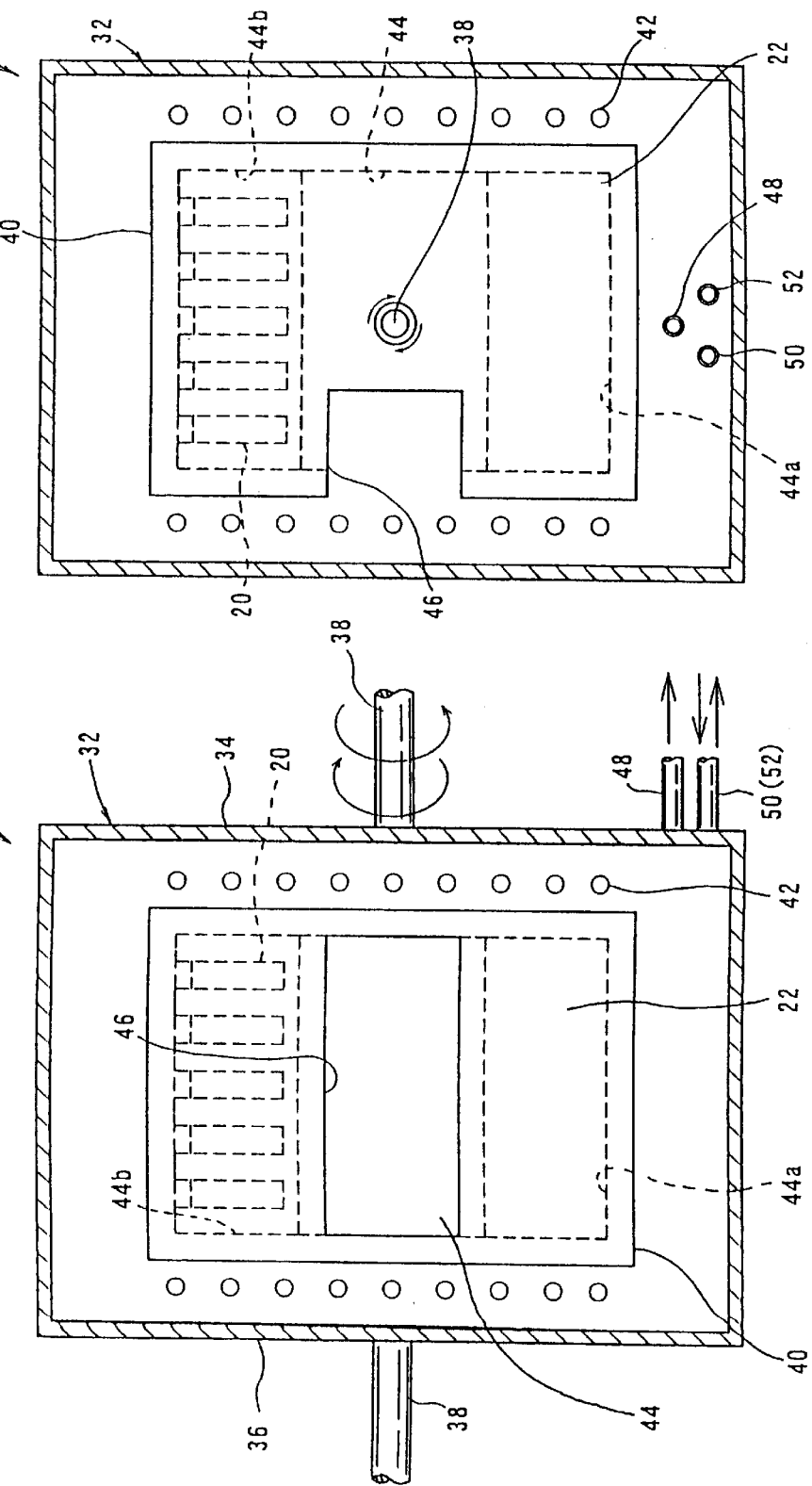
FIG. 5A shows, with partial cutaway, a front face of a high-pressure vessel.
FIG. 5B shows, with partial cutaway, a side face of the high-pressure vessel.

When the results obtained in Examples 1 to 8 are plotted while giving the coefficient of thermal conductivity along the horizontal axis and giving the coefficient of thermal expansion along the vertical axis, the characteristic obtained when SiC is impregnated with copper is assumed to be represented by a characteristic curve as shown by a curve "a" in FIG. 4. In FIG. 4, a curve "b" indicates theoretical values obtained when SiC and aluminum are subjected to powder shaping, a curve "c" indicates theoretical values obtained when SiC and copper are subjected to powder shaping, and a curve "d" indicates actually measured values obtained when SiC is impregnated with aluminum.

In FIG. 4, a region A indicated by an ellipse depicted by a dashed line represents a characteristic region of Cu—W which has been hitherto used as the material for heat sinks. As shown in FIG. 3, it is understood that Examples 6 to 8 have their characteristics which are superior to the characteristic of Cu—W described above, because of the following reason. That is, in any one of Examples 6 to 8, the range of the coefficient of thermal expansion is approximately the same as that of Cu—W, and the range of the coefficient of thermal conductivity is higher than that of Cu—W, Examples 6 to 8 being included in an optimum characteristic range (range indicated by a rectangle depicted by broken lines) B as for the material for heat sinks. Therefore, the characteristics of the composite material can be concentrated into the optimum characteristic range as for the material for heat sinks by optimizing the porosity, the pore diameter, and the pore distribution of SiC.

Next, the production methods according to the first and second embodiments will be explained with reference to FIGS. 5 to 15. The production methods according to the first and second embodiments comprise the steps which may be roughly classified into the impregnating step and the cooling step. In the impregnating step, SiC to serve as the base material and the copper or copper alloy are heated while making no contact with each other, and the both are allowed to make contact at the stage of arrival at a predetermined temperature to immediately apply a high pressure so that SiC is impregnated with the copper or copper alloy. In the cooling step, SiC impregnated with the copper or copper alloy is cooled.

At first, as specifically exemplified in FIGS. 5A and 5B, the production method according to the first embodiment is carried out by using a high-pressure vessel 30. The high-pressure vessel 30 is provided with rotary shafts 38 at approximately central portions of both side plates 34, 36 of a hollow rectangular parallelepiped housing 32 respectively. The housing 32 itself is rotatable about the rotary shafts 38 as a center.

A refractory vessel 40 and a heater 42 for heating the refractory vessel 40 are provided in the housing 32. The refractory vessel 40 has a hollow rectangular parallelepiped configuration having a hollow section 44 therein. An opening 46, which communicates with the hollow section 44, is provided at a central portion in the vertical direction at one side surface. The hollow section 44 includes one hollow section (hereinafter referred to as "first chamber 44a") comparted with respect to the central opening 46 as a center. Ingot of copper or copper alloy 22 or molten metal of copper or copper alloy 22 to be used as an impregnating material is accommodated in the first chamber 44a. A plurality pieces of SiC 20 to be used as a material to be impregnated are attached to the other hollow section (hereinafter referred to as "second chamber 44b"). A support mechanism for SiC 20 is provided so that SiC 20 does not falls off even when the second chamber 44b is located upward. The heater 42 has a structure which is not destroyed even at a high pressure of 100 kgf/cm².

The high-pressure vessel 30 is provided with a suction pipe 48 for vacuum suction, and an inlet pipe 50 and an outlet pipe 52 for a gas for applying a high pressure and a gas for cooling.

Next, the impregnating step and the cooling step, which are performed by using the high-pressure vessel 30, will be explained with reference to FIG. 6. The impregnating step is performed by executing the following steps.

At first, the high-pressure vessel 30 is allowed to be in an initial state, and the first chamber 44a of the refractory vessel 40, which is provided inside the high-pressure vessel 30, is disposed downward (step S1).

Subsequently, SiC 20 and the ingot of copper or copper alloy 22 are placed in the refractory vessel 40 of the high-pressure vessel 30. The ingot of copper or copper alloy 22 is arranged in the first chamber 44a of the refractory vessel 40, and SiC 20 is set in the second chamber 44b (step S2). After that, the high-pressure vessel 30 (and the refractory vessel 40) is tightly sealed, and then vacuum suction is performed for the inside of the high-pressure vessel 30 through the suction pipe 48 so that the inside of the high-pressure vessel 30 is in a negative pressure state (step S3).

After that, an electric power is applied to the heater 42 to heat and melt the copper or copper alloy 22 in the first chamber 44a (step S4). In the following explanation, the copper or copper alloy 22, which has been heated and melted, will be conveniently referred to as "molten copper".

Subsequently, the high-pressure vessel 30 is inverted by 180 degrees at a stage at which the molten copper in the first chamber 44a arrives at a predetermined temperature (step S5). This inverting operation allows the first chamber 44a to be disposed upward. Accordingly, the molten copper in the first chamber 44a falls downwardly by its self-weight toward the second chamber 44b disposed thereunder. At this stage, a state is given in which SiC 20 is immersed in the molten copper.

After that, an impregnating gas is introduced into the high-pressure vessel 30 through the gas inlet pipe 50 to apply a pressure to the inside of the high-pressure vessel 30 (step S6). This pressure-applying treatment allows open pores of SiC 20 to be impregnated with the molten copper.

The procedure immediately proceeds to the cooling step upon completion of the impregnating step. In the cooling step, at first, the high-pressure vessel 30 is inverted by 180 degrees again (step S7). This inverting operation allows the first chamber 44a to be disposed downward. Accordingly, the molten copper in the second chamber 44b falls downwardly toward the first chamber 44a again. The open pores of SiC 20 have been impregnated with a part of the molten copper as a result of the pressure-applying treatment (impregnating treatment) effected in the step S6. Therefore, the molten copper, which falls downwardly toward the underlying first chamber 44a, is remaining molten copper not subjected to the impregnation of SiC 20. At a stage at which the remaining molten copper has fallen downwardly toward the first chamber 44a, SiC 20 impregnated with the molten copper remains in the second chamber 44b.

Subsequently, the impregnating gas in the high-pressure vessel 30 is discharged through the gas outlet pipe 52, simultaneously with which a cooling gas is introduced into the high-pressure vessel 30 through the gas inlet pipe 50 (step S8). The discharge of the impregnating gas and the introduction of the cooling gas allow the cooling gas to thoroughly circulate through the inside of the high-pressure vessel 30, and thus the high-pressure vessel 30 is quickly cooled. In accordance with the quick cooling, the molten copper impregnated into SiC 20 is quickly solidified into mass or lump of the copper or copper alloy 22, and the volume is expanded. Thus, the copper or copper alloy 22 subjected to the impregnation is tightly retained by SiC 20.

Figure 6:
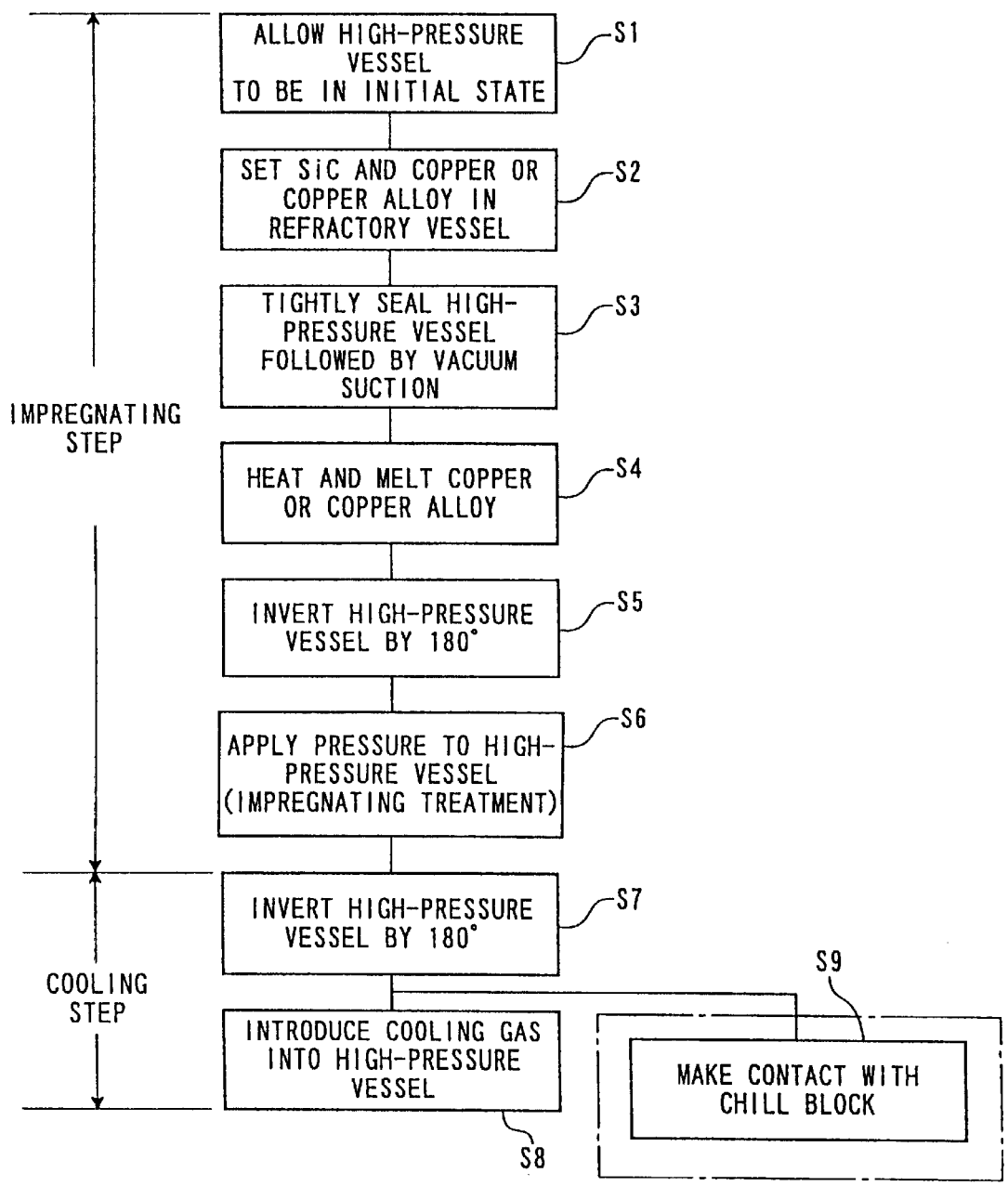
FIG. 6 shows a block diagram illustrating the steps of a production method concerning a first embodiment.

Another cooling step is available as shown in a frame depicted by dashed lines in FIG. 6. That is, the high-pressure vessel 30 or SiC 20 impregnated with the molten copper is allowed to make contact with a chill block at a stage at which the treatment in the step S7 has been completed (step S9). SiC 20 is quickly cooled by means of the contact with the chill block. The cooling process may be carried out while cooling the chill block with water, or the cooling process may be carried out while installing the chill block at a place separated from the heating body. Especially, it is preferable to perform the cooling in consideration of the risering efficiency.

As described above, the treatment for impregnating SiC 20 with the copper or copper alloy 22, which is generally considered to be difficult, can be easily performed by executing the impregnating step and the cooling step. Moreover, it is possible to improve the impregnation rate of the copper or copper alloy 22 into the SiC 20. Therefore, it possible to improve the productivity of the heat sink 10 which has characteristics adapted to the balance between the coefficient of thermal expansion and the coefficient of thermal conductivity demanded for actual electronic parts or the like (including semiconductor devices), i.e., the coefficient of thermal expansion of $4.0 \times 10^{-6}/°$C. to $9.0 \times 10^{-6}/°$C. from room temperature to 200° C., and the coefficient of thermal conductivity of 180 W/mK (room temperature) or more.

In the step S4, when the electric power is applied to the heater 42 to heat and melt the copper or copper alloy 22 in the first chamber 44a, it is desirable that the predetermined temperature (heating temperature) to proceed to the step S5 is a temperature higher than the melting point of the copper or copper alloy 22 by 30° C. to 250° C., and preferably a temperature higher than the melting point by 50° C. to 200° C. In this process, it is preferable that the inside of the high-pressure vessel 30 is in vacuum of not more than $1 \times 10^{-3}$ Torr.

In the step S6, the pressure, which is applied to the high-pressure vessel 30 by introducing the impregnating gas into the high-pressure vessel 30, is not less than 10 kgf/cm$^2$ and not more than 1000 kgf/cm$^2$. In this procedure, the pressure is preferably not less than 50 kgf/cm$^2$ and not more than 200 kgf/cm$^2$, and more preferably not less than 100 kgf/cm$^2$ and not more than 150 kgf/cm$^2$.

It is desirable that the pressure is preferably applied to the high-pressure vessel 30 for a period of time of not less than 1 minute and not more than 30 minutes, and more preferably not less than 2 minutes and not more than 10 minutes.

As described above, it is desirable for the pores of SiC 20 that those having an average diameter of 5 μm to 50 μm exist in an amount of 90% or more, and the porosity is 20% by volume to 70% by volume.

It is preferable that SiC 20 is previously plated with Ni of 1 to 10% by volume, and desirably 3 to 5% by volume, in order to improve the wettability between SiC 20 and the copper or copper alloy 22. In this case, it is possible to realize impregnation by using a low pressure. The Ni plating referred to herein includes, for example, Ni—P plating and Ni—B plating.

In order to improve the wettability between SiC 20 and the copper or copper alloy 22, it is preferable that SiC 20 is previously impregnated with 1 to 10% by volume of Si, and more desirably 3 to 5% by volume of Si. In this case, it is also possible to realize impregnation by using a low pressure.

In relation to the Ni plating previously applied by 1 to 10% by volume to SiC 20, or the previous impregnation of Si by 1 to 10% by volume, it is also preferable that SiC 20 is previously plated with palladium. In this case, in addition to the palladium plating, it is also possible to apply composite plating together with Ni and Si.

On the other hand, it is desirable that the cooling step is preferably performed at a cooling rate of not less than −400° C./hour in a range from the temperature during the impregnation to 800° C., and more preferably not less than −800° C./hour.

In the step S6, the pressure applied to the high-pressure vessel 30 is a pressure necessary to completely impregnate the open pores of SiC 20 with the copper or copper alloy 22. In this process, if open pores, which are not impregnated with the copper or copper alloy 22, remain in SiC 20, the heat conductivity is markedly inhibited. Therefore, it is necessary to apply a high pressure.

The pressure can be approximately estimated in accordance with the expression of Washburn. However, the smaller the pore diameter is, the larger the required force is. For example, the required pressure is 400 kgf/cm$^2$ in the case of 0.1 μmφ, 40 kgf/cm$^2$ in the case of 1.0 μmφ, and 4 kgf/cm$^2$ in the case of 10 μmφ respectively.

A reaction occurs between SiC 20 and the copper or copper alloy 22 at a high temperature. SiC 20 is decomposed into Si and C, and the original function is not exhibited. For this reason, it is necessary to shorten the period of time during which SiC 20 makes direct contact with the copper or copper alloy 22 at the high temperature. It is possible to shorten the contact time between SiC 20 and the copper or copper alloy 22 by satisfying the first treatment condition (pressure applied to the high-pressure vessel 30= not less than 10 kgf/cm$^2$ and not more than 1000 kgf/cm$^2$), the second treatment condition (heating temperature= temperature higher than the melting point of the copper or copper alloy 22 by 30° C. to 250° C.), and the third treatment condition (1 to 10% by volume of Ni plating is previously applied to SiC 20). Accordingly, it is possible to avoid the decomposition reaction of SiC 20 as described above beforehand.

The wettability is poor between SiC 20 and the copper or copper alloy 22. Therefore, it is necessary to apply the high pressure in order to sufficiently perform the impregnation with the copper or copper alloy 22. The pore surface of SiC 20 is modified in quality to give good wettability between SiC 20 and the copper or copper alloy 22 by effecting the third treatment condition (1 to 10% by volume of Ni plating is previously applied to SiC 20) or the fourth treatment condition (SiC 20 is previously impregnated with 1 to 10% by volume of Si). Accordingly, it is possible to impregnate finer pores with the copper or copper alloy 22 at a lower pressure.

An illustrative experiment will now be described. In this illustrative experiment, observation was made for the difference in reaction situation of SiC/Cu and impregnation situation of Cu obtained by appropriately changing the porosity of SIC 20, the pore diameter, the presence or absence of Ni plating, the presence or absence of Si impregnation, the impregnation temperature, the applied pressure, the pressure-applying time, and the cooling rate. Obtained experimental results are shown in a table in FIG. 7. In FIG. 7, the situation of the reaction of SiC/Cu was determined by the thickness (average value) of the reaction layer formed between SiC and Cu. The determinative condition in the experiment is as follows. The basis of the determinative condition is the fact that when the reaction layer of not less than 5 μm is produced between SiC and Cu, the thermal transfer between SiC and Cu is deteriorated, resulting in decrease in thermal conductivity when the obtained material is used as a composite material for heat sinks for semiconductor devices.

Thickness (average) of reaction layer is not more than 1 μm→ "no reaction";

Thickness (average) of reaction layer is more than 1 μm and not more than 5 μm→ "less reaction";

Thickness (average) of reaction layer is more than 5 μm→ "much reaction".

According to the experimental results, as for any one of those which satisfy the predetermined ranges of the porosity of SiC 20, the pore diameter, the impregnation temperature, the applied pressure, the pressure-applying time, and the cooling rate (Samples 3, 7, 8, 11, and 12), the reaction situation of SiC/Cu is "no reaction", and the impregnation situation of Cu is good. Thus, good results are obtained.

Concerning Samples 3, 7, 8, 11, and 12 described above, the Ni plating or the Si impregnation is performed for Samples 3, 7, 11, and 12. Therefore, the wettability with respect to Cu is good, and the good results are obtained as described above even when the pressure-applying time is short. As for Sample 8, the Ni plating and the Si impregnation are not performed. However, the pressure-applying time is successfully shortened by increasing the applied pressure. Thus, the good results are obtained as described above.

On the other hand, as for Samples 1, 5, and 9 in which the applied pressure is 8 kgf/cm$^2$ which is lower than the predetermined range, the impregnation situation of Cu is insufficient for any of them. Concerning Samples 1, 5, and 9 described above, the reaction situation of SiC/Cu is "much reaction" for those having the long pressure-applying time (Samples 1 and 5).

As for Sample 6, the impregnation situation is insufficient, although the reaction situation of SiC/Cu is "less reaction", probably because the porosity and the pore diameter do not satisfy the predetermined ranges respectively. As for Sample 14, the reaction situation of SiC/Cu is "much reaction", although the impregnation situation is good, probably because the pore diameter is larger than the predetermined range, and the pressure-applying time is relatively long.

Incidentally, for example, a sintered compact of Si—SiC containing a major phase comprising 2 to 25% by weight of Si and 75 to 98% by weight of SiC can be used as SiC impregnated with Si (Si—SiC sintered compact) which has good wettability with respect to the copper or copper alloy 22. In order to obtain the Si—SiC sintered compact, it is preferable that Al impurity is controlled to be not more than 0.2 part by weight and SiO$_2$ is controlled to be not more than 3.0 parts by weight with respect to 100 parts by weight of the major phase respectively, and that the entire amount of impurities is controlled to be 0.4 to 4.2 parts by weight with respect to 100 parts by weight of the major phase.

Specifically, a method for producing the Si—SiC sintered compact will be briefly described. At first, as for the material for shaping, a row material containing SiC powder, carbon powder, organic binder, and water or organic solvent is used.

The material for shaping is mixed and kneaded, and it is shaped into a predetermined shape to prepare a compact. Subsequently, the compact is placed in an atmosphere of inert gas at a reduced-pressure or in vacuum in a metallic silicon atmosphere. The compact is impregnated with the metallic silicon to produce the Si—SiC sintered compact.

Any of the press shaping, the casting shaping, and the extrusion molding may be available as the shaping method. However, it is preferable to use the press shaping in view of mass production performance. The hydraulic press is preferably used as a method for applying the pressure. In this case, the hydraulic press pressure is usually 50 to 2000 kg/cm$^2$.

Next, several modified embodiments concerning the impregnating step of the production method according to the first embodiment will be explained with reference to FIGS. 8 and 9.

Figure 8:
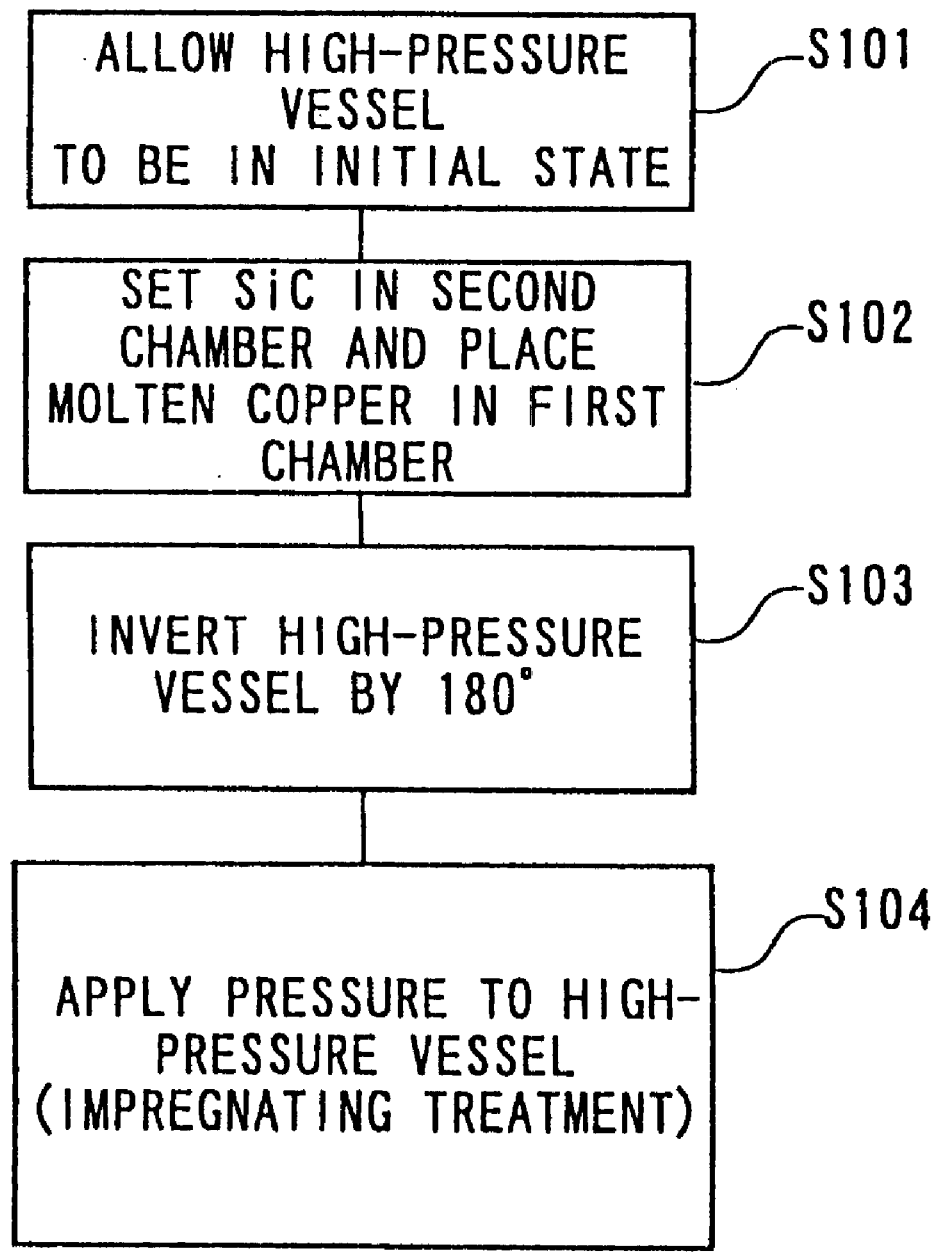
FIG. 8 shows a block diagram illustrating the impregnating step concerning a first modified embodiment.

As shown in FIG. 8, in the impregnating step concerning the first modified embodiment, at first, the high-pressure vessel 30 is allowed to be in an initial state. The first chamber 44a of the refractory chamber 40 provided in the high-pressure vessel 30 is disposed downward (step S101).

After that, SiC 20 is set in the second chamber 44b, and the previously melted copper or copper alloy (molten copper) 22 is poured into the first chamber 44a (step S102).

Subsequently, the high-pressure vessel 30 is inverted by 180 degrees at a stage at which the molten copper in the first chamber 44a arrives at a predetermined temperature (step S103). This inverting operation allows the molten copper in the first chamber 44a to fall downwardly toward the underlying second chamber 44b. At this stage, a state is given in which SiC 20 is immersed in the molten copper.

After that, the impregnating gas is introduced into the high-pressure vessel 30 through the gas inlet pipe 50 to apply the pressure to the inside of the high-pressure vessel 30 (step S104). This pressure-applying treatment allows the open pores of SiC to be impregnated with the molten copper.

Next, the impregnating step concerning the second modified embodiment will be explained. The impregnating step concerning the second modified embodiment is based on the use of a high-pressure vessel 30 having a partition wall (not shown) composed of a porous ceramic member provided at an internal central portion of a refractory vessel 40 installed in the high-pressure vessel 30. The inside of the refractory vessel 40 is comparted by the partition wall into a first chamber 44a and a second chamber 44b.

It is desirable that a porous ceramic member having a porosity of 40% to 90% and a pore diameter of 0.5 mm to 3.0 mm is used as the partition wall. More preferably, it is desirable to use a ceramic member having a porosity of 70% to 85% and a pore diameter of 1.0 mm to 2.0 mm.

Figure 9:
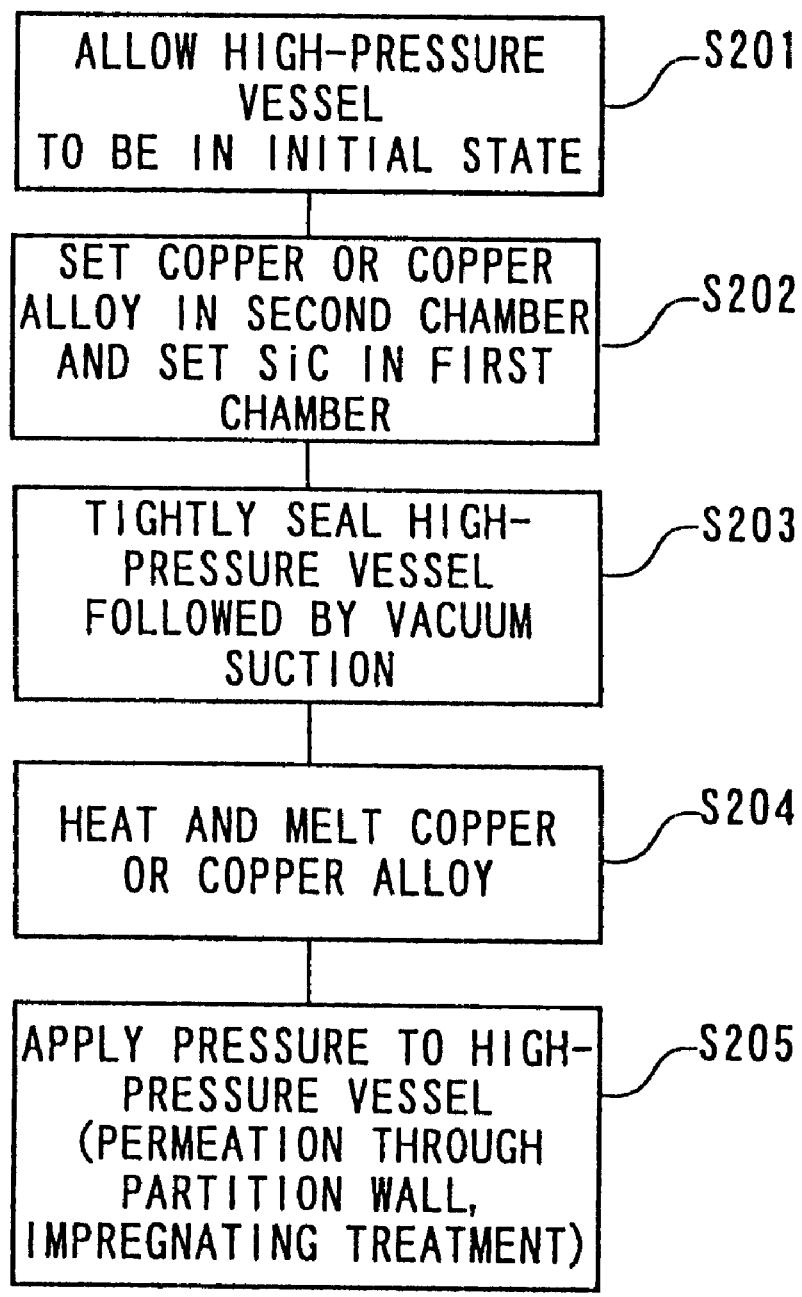
FIG. 9 shows a block diagram illustrating the impregnating step concerning a second modified embodiment.

In the impregnating step concerning the second modified embodiment, at first, as shown in FIG. 9, the high-pressure vessel is allowed to be in an initial state. The first chamber 44a of the refractory vessel 40 provided in the high-pressure vessel is disposed downward, and the second chamber 44b is disposed upward (step S201).

After that, SiC 20 and ingot of copper or copper alloy 22 are placed in the refractory vessel 40 of the high-pressure vessel 30. The ingot of copper or copper alloy 22 is disposed in the second chamber 44b located upward, and SiC 20 is set in the first chamber 44a located downward (step S202).

Subsequently, the high-pressure vessel 30 (and the refractory vessel 40) is tightly sealed, and then vacuum suction is performed for the inside of the high-pressure vessel 30 through the suction pipe 48 so that the inside of the high-pressure vessel 30 is in a negative pressure state (step S203).

After that, an electric power is applied to the heater 42 to heat and melt the copper or copper alloy 22 in the second chamber 44b (step S204). The impregnating gas is introduced into the high-pressure vessel 30 through the gas inlet pipe 50 at a stage at which the molten copper arrives at a predetermined temperature to apply a pressure to the inside of the high-pressure vessel 30 (step S205). This pressure-applying treatment allows the molten copper in the second chamber 44b disposed upward to pass through the partition wall, and thus open pores of SiC 20 in the first chamber 44a disposed downward are impregnated therewith.

Next, a production method according to a second embodiment will be explained with reference to FIGS. 10 to 15.

Figure 10:
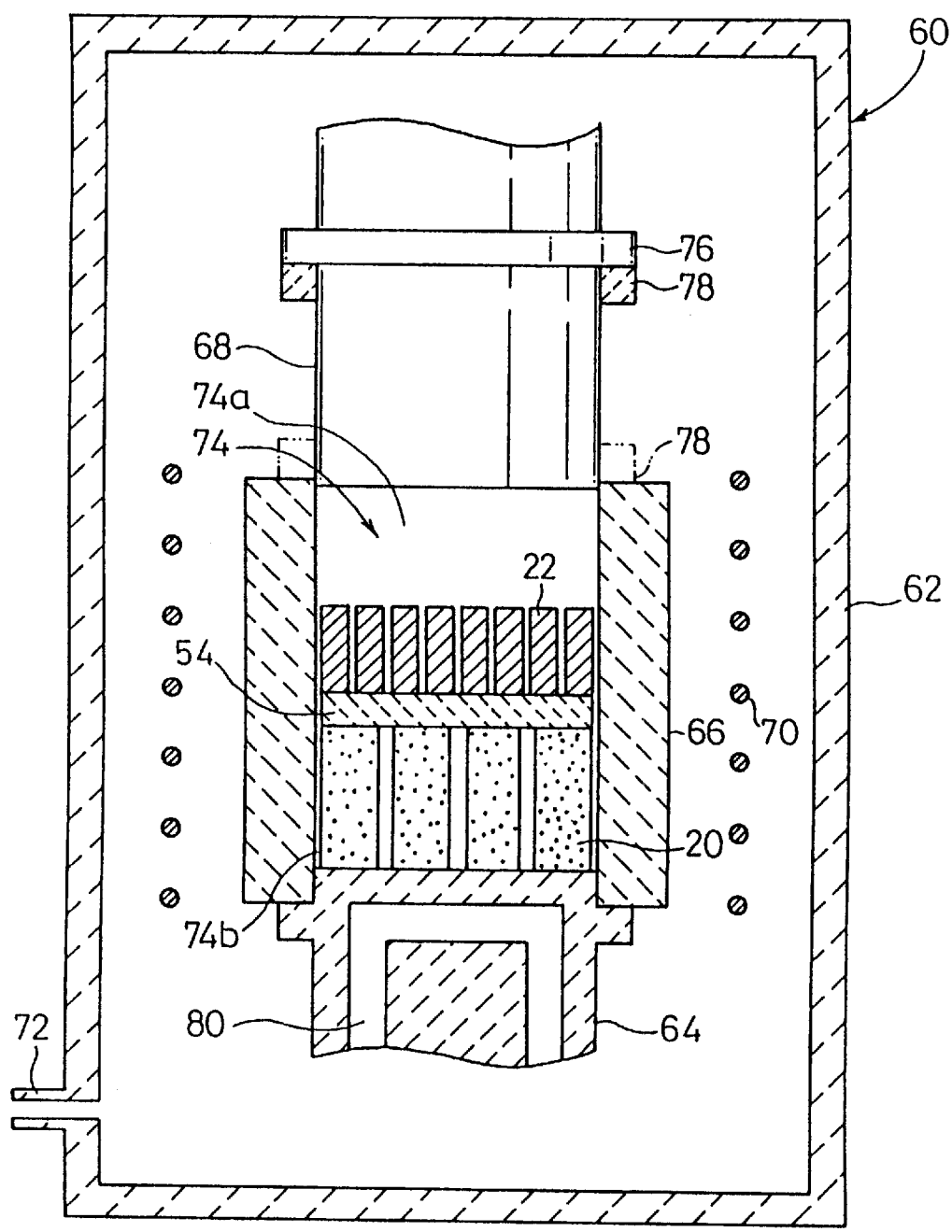
FIG. 10 shows schematic construction of a hot press furnace used for a production method concerning a second embodiment.

Specifically, the production method according to the second embodiment is carried out by using a hot press furnace 60 as exemplified in FIG. 10. The hot press furnace 60 includes, in a cylindrical housing 62, a lower punch 64 which also serves as a base, a refractory vessel 66 which has an opening at its upper surface and which is fixed to the lower punch 64, an upper punch 68 which is movable frontwardly and rearwardly from an upper position into the refractory vessel 66, and a heater 70 for heating the refractory vessel 66. The hot press furnace 60 further comprises a suction pipe 72 for vacuum suction.

The refractory vessel 66 has a cylindrical shape having a hollow section 74. The upper punch 68 is provided at its side surface with a flange 76 for determining the stroke of the upper punch 68. The flange 76 has its lower surface which is attached with a packing 78 for making contact with an upper circumferential surface of the refractory vessel 66 to provide a tightly sealed state for the refractory vessel 66. On the other hand, the lower punch 64 includes, at its inside, a passage 80 for allowing a heating fluid for heating the inside of the refractory vessel 66 and a cooling fluid for cooling the inside of the refractory vessel 66 to flow therethrough.

Figure 11:
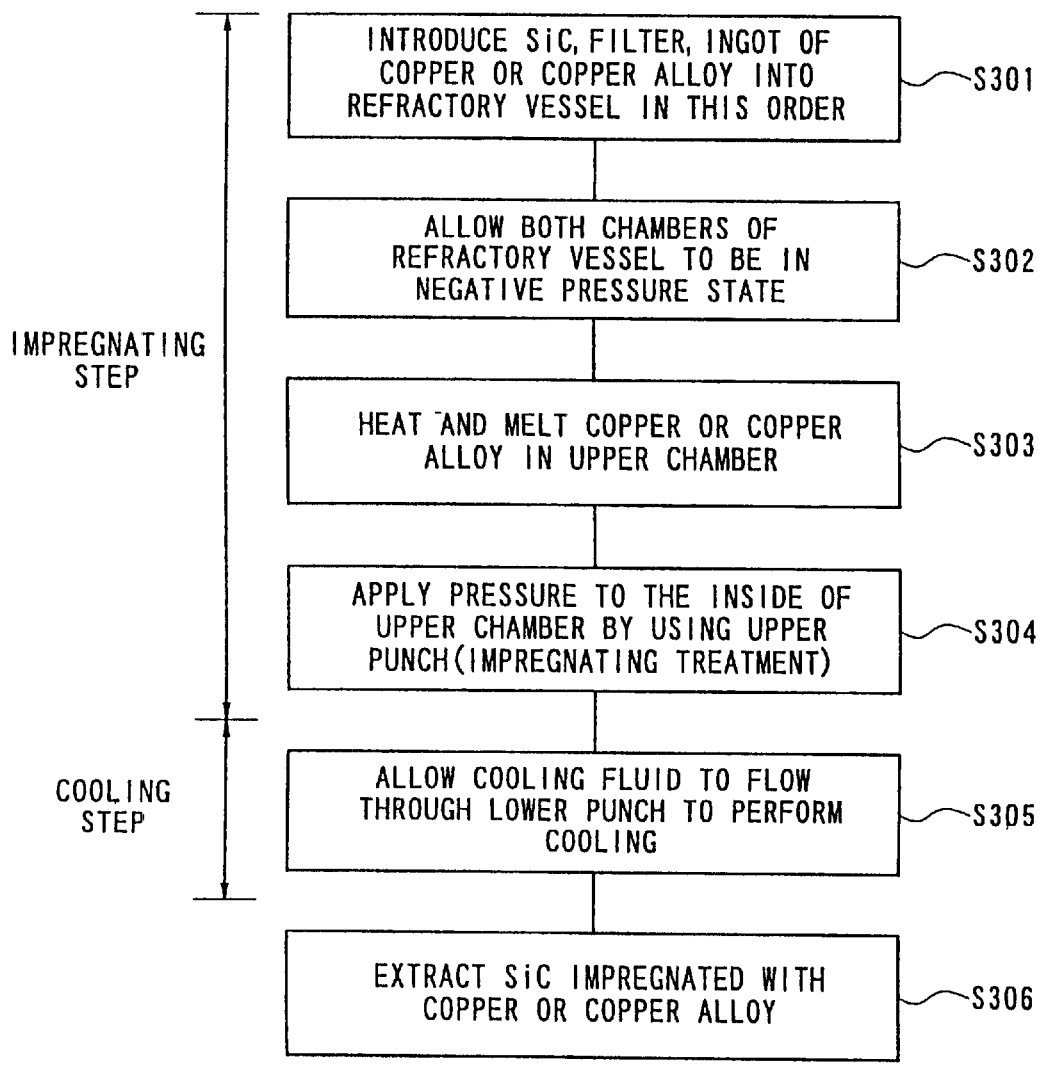
FIG. 11 shows a block diagram illustrating the steps of a production method concerning a second embodiment.

The production method according to the second embodiment is carried out by executing the steps shown in FIG. 11.

At first, SiC 20, a filter 54 composed of porous ceramic, and ingot of copper or copper alloy 22 are introduced into the hollow section 74 of the refractory vessel 66 in this order from the bottom (step S301). It is desirable that a porous ceramic member having a porosity of 40% to 90% and a pore diameter of 0.5 mm to 3.0 mm is used as the filter 54. More preferably, it is desirable to use a ceramic member having a porosity of 70% to 85% and a pore diameter of 1.0 mm to 2.0 mm.

The filter 54 also functions as a partition wall for partitioning SiC 20 from the ingot of copper or copper alloy 22 to allow the both to be in a non-contact state. A portion of the hollow section 74, to which the ingot of copper or copper alloy 22 is set over the filter 54, may be defined as an upper chamber 74a. A portion of the hollow section 74, to which SiC 20 is set under the filter 54, may be defined as a lower chamber 74b.

Next, after tightly sealing the refractory vessel 66, the inside of the refractory vessel 66 is subjected to vacuum suction through the suction pipe 72 so that the inside of the both chambers 74a, 74b of the refractory vessel 66 is in a negative pressure state (step S302).

After that, an electric power is applied to the heater 70 to heat and melt the copper or copper alloy 22 in the upper chamber 74a (step S303). During this process, the heating fluid may be allowed to flow through the passage 80 in the lower punch 64 together with the electric power application to the heater 70 so that the inside of the refractory vessel 66 is heated.

At a stage at which the melted matter (molten copper) of the copper or copper alloy 22 in the upper chamber 74a arrives at a predetermined temperature, the upper punch 68 is moved downwardly to pressurize the inside of the upper chamber up to a predetermined pressure (step S304). At this time, the refractory vessel 66 is tightly sealed in accordance with the contact and the mutual pressing effected between the upper circumferential surface of the refractory vessel 66 and the packing 78 attached to the flange 76 of the upper punch 68. Thus, it is possible to effectively avoid the inconvenience that the molten copper contained therein would be leaked out to the outside of the refractory vessel 66.

The melted matter (molten copper) of the copper or copper alloy 22 in the upper chamber 74a, which has arrived at the predetermined pressure, is extruded by the pressure in the upper chamber 74a through the filter 54 toward the lower chamber 74b, and it is introduced into the lower chamber 74b, simultaneously with which SiC 20 installed in the lower chamber 74b is impregnated therewith.

At a stage of arrival at the end point (point of time at which the impregnation of the molten copper into SiC 20 is in a saturated state) previously set by time management, in turn, the cooling fluid is allowed to flow through the passage 80 in the lower punch 64 to cool the refractory vessel 66 from lower portions to upper portions (step S305). Thus, the molten copper impregnated into SiC 20 is solidified. The pressure-applied state in the refractory vessel 66, which is effected by the upper punch 68 and the lower punch 64, is maintained until completion of the solidification.

At the point of time of completion of the solidification, SiC 20 impregnated with the copper or copper alloy 22 is extracted from the refractory vessel 66 (step S306).

In this production method, SiC 20 and the copper or copper alloy 22 are heated while performing sufficient deaeration, and the copper or copper alloy 22 is melted, followed by the prompt contact with SiC 20 to give the pressure-applied state for them. Further, the pressure-applied state is maintained until completion of the cooling operation. Therefore, it is possible to efficiently impregnate SiC 20 with the copper or copper alloy 22. In the embodiment described above, the impregnating treatment is performed at the negative pressure. However, the impregnating treatment may be performed at an ordinary pressure.

As described above, after both of the molten copper and SiC 20 are allowed to be in the pressure-applied state, they are allowed to make contact with each other to perform the impregnating treatment. Accordingly, the pressure drop, which would occur upon the contact of the both, can be minimized. Thus, it is possible to well maintain the pressure-applied state during the impregnating treatment.

Figure 12A:
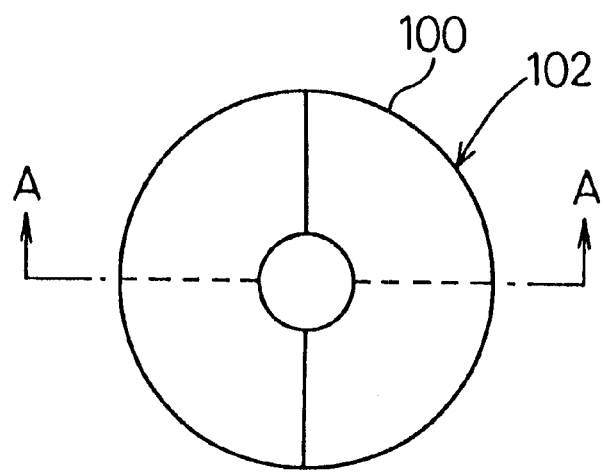
FIG. 12A shows a plan view illustrating a split-type packing member.
Figure 12B:
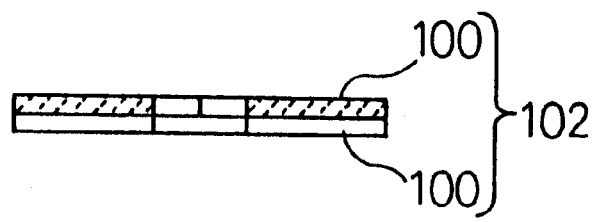
FIG. 12B shows a cross-sectional view taken along a line A—A shown in FIG. 12A.
Figure 13:
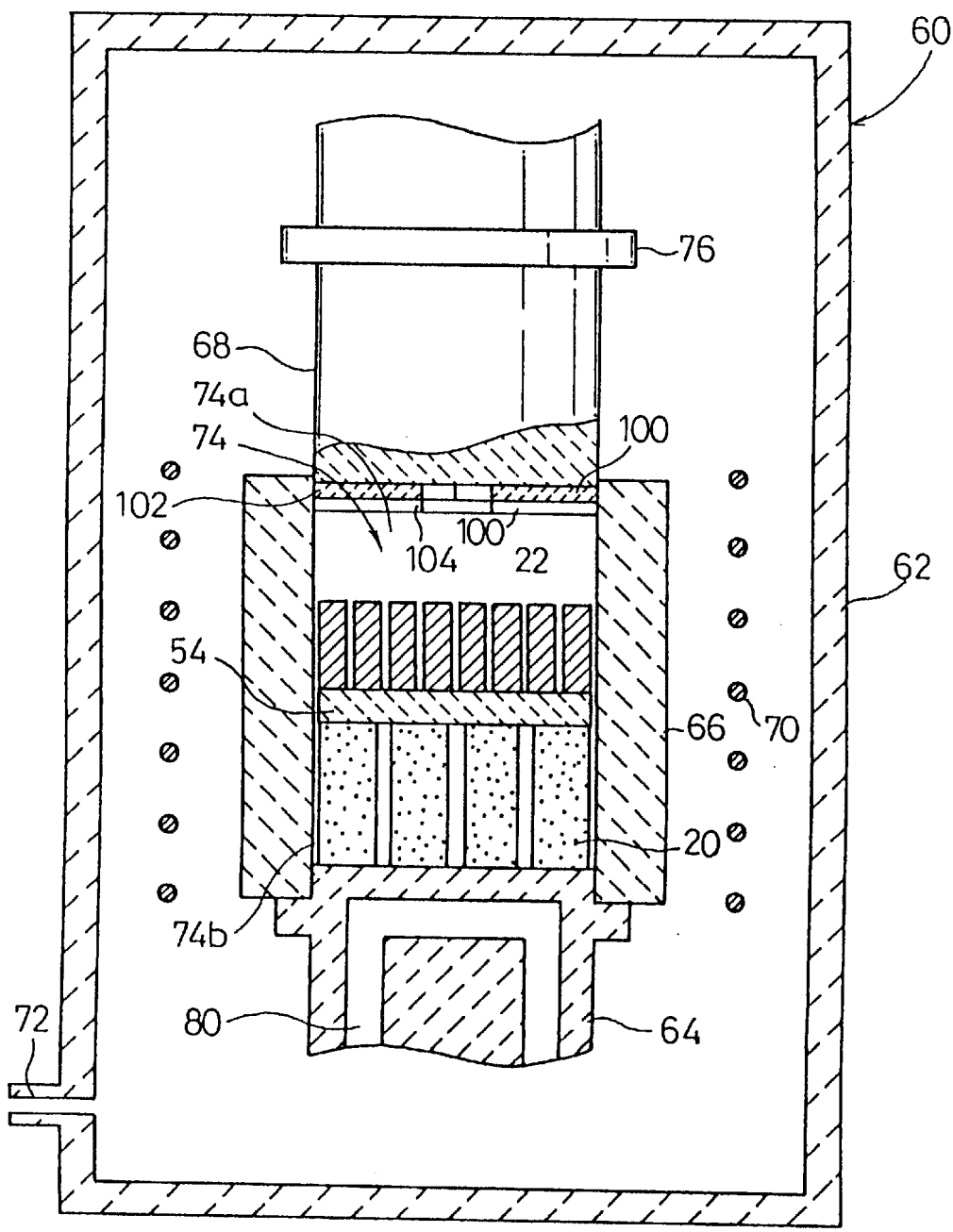
FIG. 13 shows schematic construction of another embodiment of the hot press furnace used for the production method concerning the second embodiment.

In the embodiment described above, the packing 78 is provided at the lower surface of the flange 76 of the upper punch 68 in order to avoid leakage of the molten copper. However, as shown by two-dot chain lines in FIG. 10, a packing 78 may be provided on the upper circumferential surface of the refractory vessel 66. Alternatively, as shown in FIG. 12A, a packing member 102, which comprises two superimposed ring-shaped split-type packings 100, may be provided at a lower portion of the upper punch 68 as shown in FIG. 13. In this arrangement, the molten copper enters a hollow section 104 of the packing member 102. Thus, the diameter of each of the split-type packings 100 is increased. Consequently, the upper chamber 74a is tightly sealed, and thus the molten copper is prevented from leakage.

Next, a modified embodiment of the production method according to the second embodiment will be explained with reference to FIGS. 14 and 15. Components or parts corresponding to those shown in FIG. 10 are designated by the same reference numerals, duplicate explanation of which will be omitted.

Figure 14:
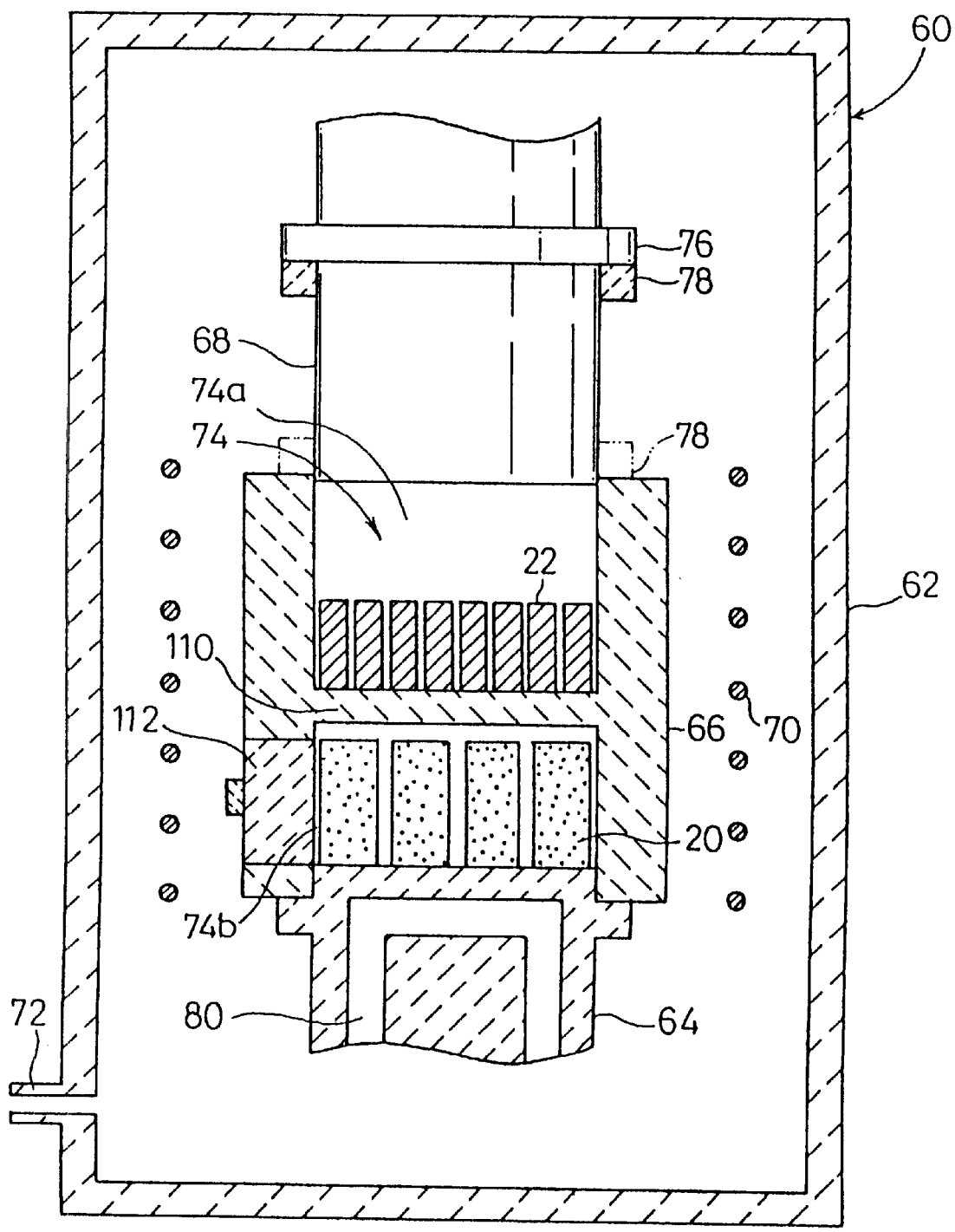
FIG. 14 shows a hot press furnace used for a modified embodiment of the production method concerning the second embodiment.

As shown in FIG. 14, the production method concerning this modified embodiment is based on the use of a hot press furnace 60 comprising a filter member 110 composed of porous ceramic which is secured to a central portion in the vertical direction of the hollow section 74 of the refractory vessel 66, and a door 112 which is attached to a side surface of the lower chamber 74b and which is freely capable of being opened and closed. Therefore, the portion of the hollow section 74 of the refractory vessel 66, which is located higher than the filter member 110, serves as the upper chamber 74a. The portion, which is located lower than the filter member 110, serves as the lower chamber 74b. Especially, as for the door 112 attached to the lower chamber 74b, a structure is adopted so that the lower chamber 74b is tightly sealed when the door 112 is closed.

Figure 15:
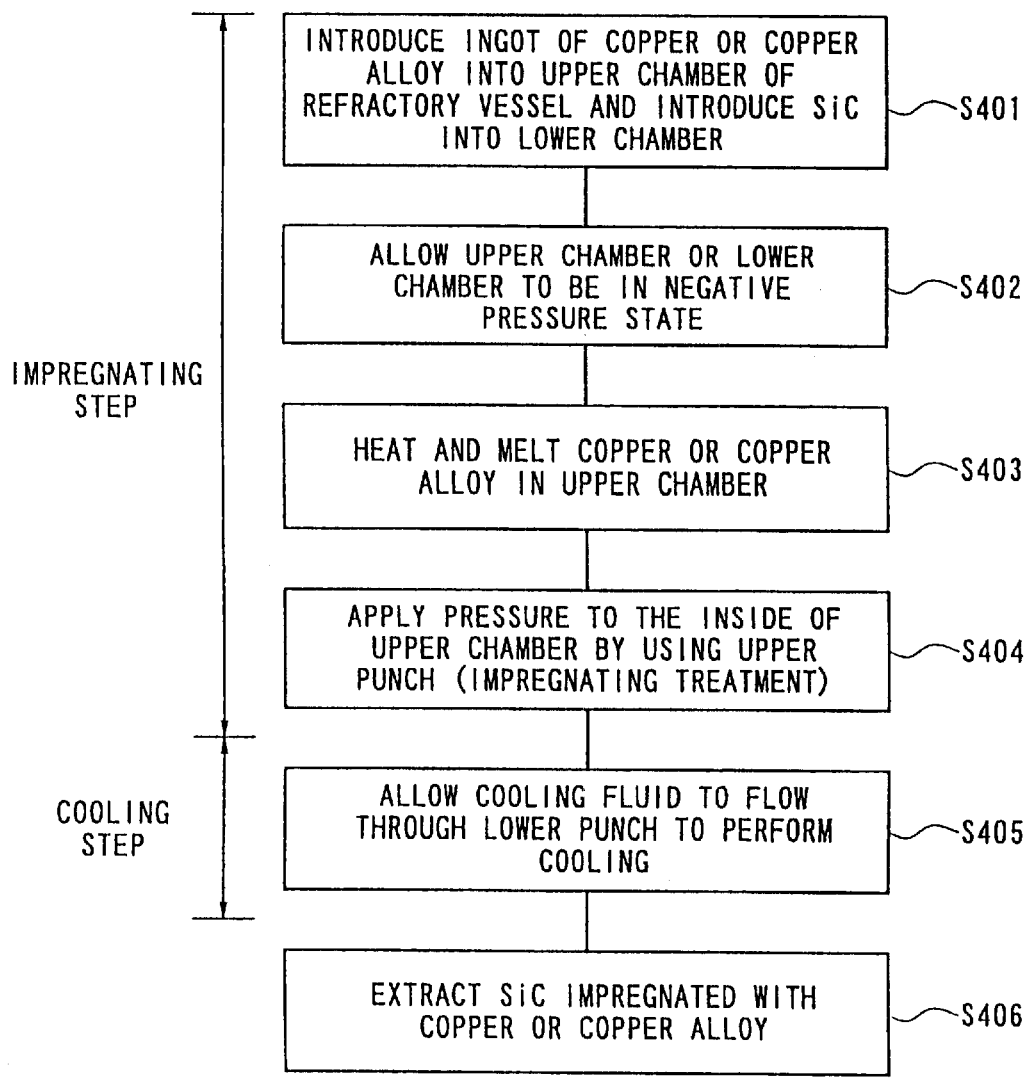
FIG. 15 shows a block diagram illustrating the steps of a modified embodiment of the production method concerning the second embodiment.

The production method concerning the modified embodiment is carried out by executing the steps shown in FIG. 15.

At first, ingot of copper or copper alloy 22 is introduced into the upper chamber 74a of the refractory vessel 66. The door 112 of the lower chamber 74b is opened, and SiC 20 is introduced into the lower chamber 74b (S401).

Next, the door 112 is closed to tightly seal the lower chamber 74b, and the hot press furnace 60 is tightly sealed. After that, the inside of the refractory vessel 66 is subjected to vacuum suction through the suction pipe 72 so that the inside of the both chambers 74a, 74b of the refractory vessel 66 is in a negative pressure state (step S402).

After that, an electric power is applied to the heater 70 to heat and melt the copper or copper alloy 22 in the upper chamber 74a (step S403). Also in this embodiment, the heating fluid may be allowed to flow through the passage 80 in the lower punch 64 together with the electric power application to the heater 70 so that the inside of the refractory vessel 66 is heated.

At a stage at which the melted matter (molten copper) of the copper or copper alloy 22 in the upper chamber 74a arrives at a predetermined temperature, the upper punch 68 is moved downwardly to pressurize the inside of the upper chamber 74a up to a predetermined pressure (step S404).

The melted matter (molten copper) of the copper or copper alloy 22 in the upper chamber 74a, which has arrived at the predetermined pressure, is extruded by the pressure in the upper chamber 74a through the filter member 110 toward the lower chamber 74b, and it is introduced into the lower chamber 74b, simultaneously with which SiC 20 installed in the lower chamber 74b is impregnated therewith.

At a stage of arrival at the end point previously set by time management, in turn, the cooling fluid is allowed to flow through the passage 80 in the lower punch 64 to cool the refractory vessel 66 from lower portions to upper portions (step S405). Thus, the molten copper impregnated into SiC 20 is solidified.

At the point of time of completion of the solidification, SiC impregnated with the copper or copper alloy is extracted from the refractory vessel (step S406).

Also in the production method concerning this modified embodiment, it is possible to efficiently impregnate SiC 20 with the copper or copper alloy 22, in the same manner as the production method according to the second embodiment. Also in this embodiment, after both of the molten copper and SiC 20 are allowed to be in the pressure-applied state, they are allowed to make contact with each other to perform the impregnating treatment. Accordingly, the pressure drop, which would occur upon the contact of the both, can be minimized. Thus, it is possible to well maintain the pressure-applied state during the impregnating treatment. In the embodiment described above, the impregnating treatment is performed at the negative pressure. However, the impregnating treatment may be performed at an ordinary pressure.

Next, a production method according to a third embodiment will be explained with reference to FIGS. 16 and 17. Components or parts corresponding to those shown in FIG. 10 are designated by the same reference numerals, duplicate explanation of which will be omitted.

The production method according to the third embodiment is substantially the same in principle as the production method according to the second embodiment. However, the former is different from the latter in that in the impregnating step, SiC 20 is allowed to make contact with the copper or copper alloy 22 at a negative pressure or at an ordinary pressure, and they are subjected to a heating treatment to melt the copper or copper alloy 22.

Figure 16:
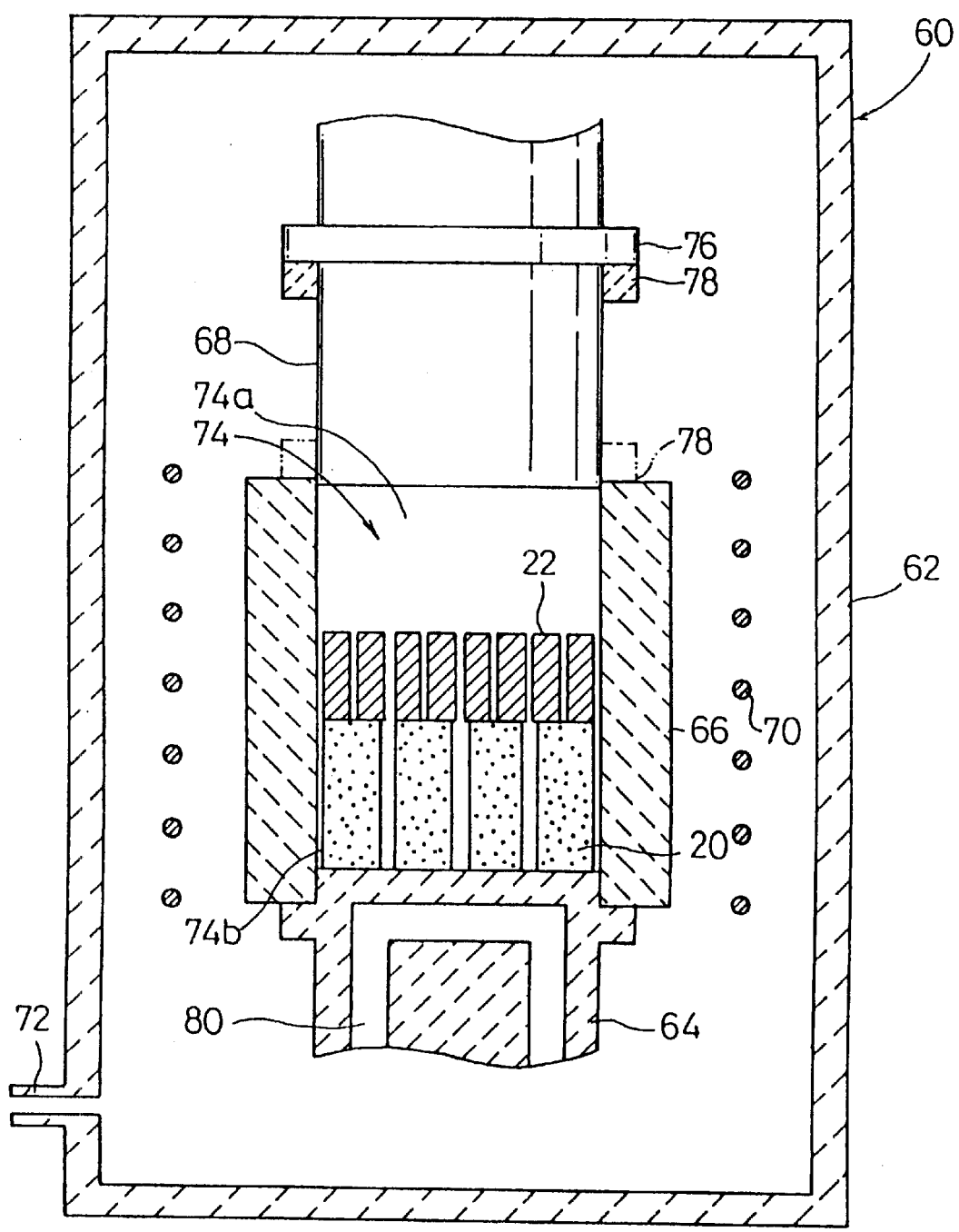
FIG. 16 shows construction of a hot press furnace used for a production method concerning a third embodiment.

Specifically, as shown in FIG. 16, the production method according to the third embodiment is different from the production method according to the second embodiment in that the filter 54 is not employed in the refractory vessel 66 of the hot press furnace 60 used in the production method according to the second embodiment, but SiC 20 and the copper or copper alloy 22 are introduced in this order from the bottom.

Figure 17:
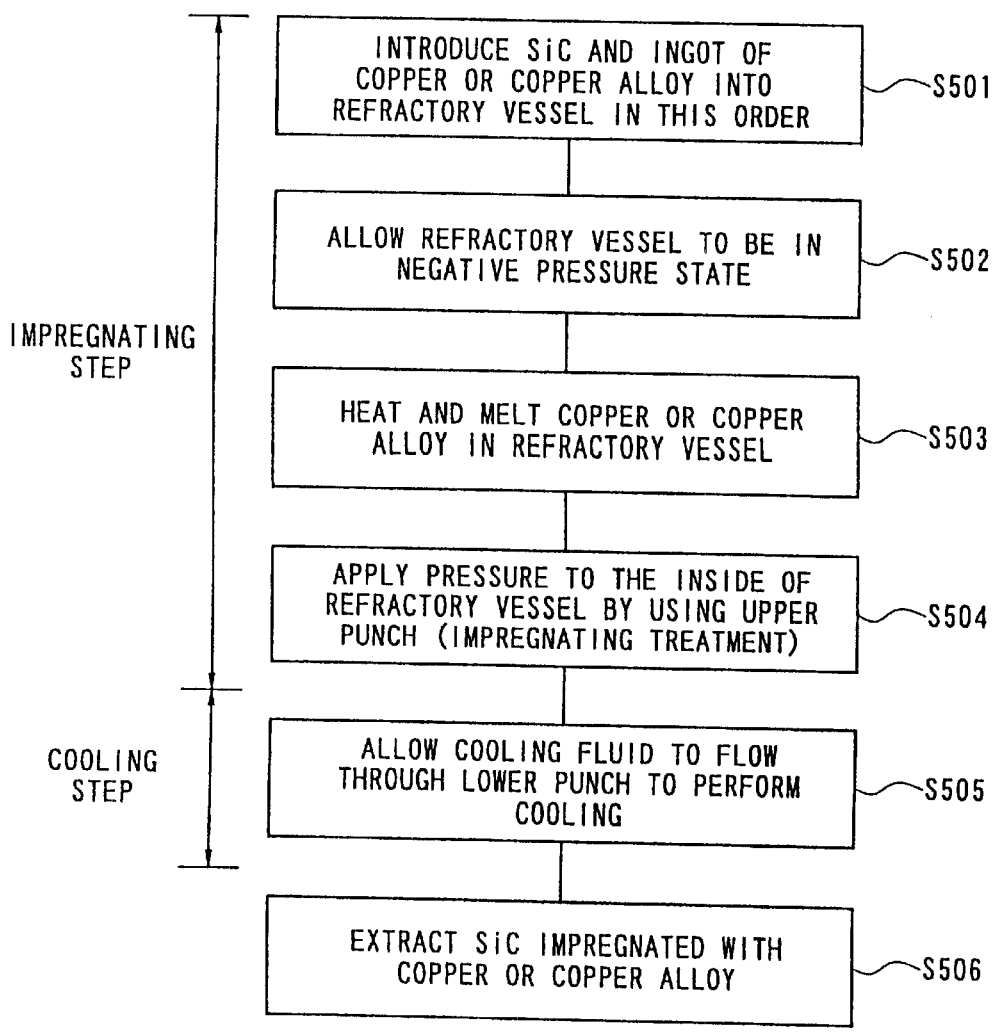
FIG. 17 shows a block diagram illustrating the steps of the production method concerning the third embodiment.

The production method according to the third embodiment is carried out by executing the steps shown in FIG. 17.

At first, SiC 20 and ingot of copper or copper alloy 22 are introduced into the hollow section 74 of the refractory vessel 66 in this order from the bottom (step S501).

Next, the hot press furnace 60 is tightly sealed. After that, the inside of the refractory vessel 66 is subjected to vacuum suction through the suction pipe 72 so that the inside of the refractory vessel 66 is in a negative pressure state (step S502).

After that, an electric power is applied to the heater 70 to heat and melt the copper or copper alloy 22 in the refractory vessel 66 (step S503). During this process, the heating fluid may be allowed to flow through the passage 80 in the lower punch 64 together with the electric power application to the heater 70 so that the inside of the refractory vessel 66 is heated.

At a stage at which the melted matter (molten copper) of the copper or copper alloy 22 in the refractory vessel 66 arrives at a predetermined temperature, the upper punch 68 is moved downwardly to pressurize the inside of the refractory vessel 66 up to a predetermined pressure (step S504).

The melted matter (molten copper) of the copper or copper alloy 22, which has arrived at the predetermined pressure, is impregnated into SiC 20 in accordance with the pressure in the refractory vessel 66.

At a stage of arrival at the end point (point of time at which the impregnation of the molten copper into SiC 20 is in a saturated state) previously set by time management, in turn, the cooling fluid is allowed to flow through the passage 80 in the lower punch 64 to cool the refractory vessel 66 from lower portions to upper portions (step S505). Thus, the molten copper impregnated into SIC 20 is solidified. The pressure-applied state in the refractory vessel 66, which is effected by the upper punch 68 and the lower punch 64, is maintained until completion of the solidification.

At the point of time of completion of the solidification, SiC 20 impregnated with the copper or copper alloy 22 is extracted from the refractory vessel 66 (step S506).

Also in this production method, SiC 20 and the copper or copper alloy 22 are heated while performing sufficient deaeration to melt the copper or copper alloy 22 in the state of contact between the copper or copper alloy 22 and SiC 20, followed by giving the pressure-applied state in the refractory vessel 66. Further, the pressure-applied state is maintained until completion of the cooling operation. Thus, it is possible to efficiently impregnate SiC 20 with the copper or copper alloy 22.

In the embodiment described above, the metal with which SiC 20 is impregnated is the copper or copper alloy 22. However, the copper may contain impurities such as 0.001% by weight to 0.1% by weight of Ca, Ag, Cd, Zn, Au, Pd, In, Ga, Pt, Cr, Ge, Rh, Sb, Ir, Co, As, Zr, Fe, Sn, Mn, P, and Pb, and gas components. Of course, the copper may be pure copper.

SiC 20 is used as the porous sintered compact to be subjected to the impregnation. However, those usable is not limited to SiC but include porous sintered compacts having the bending strength of not less than 10 MPa, such as AlN, $Si_3N_4$, $B_4C$, and BeO.

It is a matter of course that the composite material for heat sinks for semiconductor devices and the method for producing the same according to the present invention are not limited to the embodiments described above, and the present invention may be embodied in other various forms without deviating from the gist or essential characteristics thereof.

What is claimed is:

1. A method for producing a composite material for heat sinks for semiconductor devices using a porous sintered compact and molten metal that react with one another, said method comprising:

an impregnating step of heating said porous sintered compact to serve as a base material and a metal containing at least copper, said porous sintered compact and said metal initially being in separate chambers of the same vessel in a state of making no contact with each other in order to minimize decomposition of said porous sintered compact due to the reactivity of said metal upon heating, said impregnating step further comprising waiting until a predetermined temperature is reached before bringing said porous sintered compact and said metal into contact with each other thereby making contact between said porous sintered compact and said metal at a stage of arrival at said predetermined temperature, and immediately applying a predetermined pressure so that said porous sintered compact is impregnated with said metal; and a cooling step of cooling said porous sintered compact impregnated with at least said metal at a cooling rate of at least −480° C./min in order to minimize contact time between said impregnated porous sintered compact and said reactive molten metal.

2. The method for producing said composite material for heat sinks for semiconductor devices according to claim 1, wherein said impregnating step comprises the steps of:

arranging said metal at a lower portion of said vessel, and then allowing said vessel to be in a negative pressure state or in an ordinary pressure state therein;

heating and melting said metal to convert said metal into molten metal;

inverting said vessel at a stage at which said molten metal arrives at said predetermined temperature to immerse said porous sintered compact in said molten metal in said vessel; and impregnating said porous sintered compact with said molten metal by introducing an impregnating gas into said vessel to apply said predetermined pressure in said vessel.

3. The method for producing said composite material for heat sinks for semiconductor devices according to claim 1, wherein said impregnating step comprises the steps of:

placing said metal having been previously melted and said porous sintered compact into said vessel, arranging said molten metal at a lower portion of said vessel, and then allowing said vessel to be in a negative pressure state or in an ordinary pressure state therein;

inverting said vessel at a stage at which said molten metal arrives at said predetermined temperature to immerse said porous sintered compact in said molten metal in said vessel; and impregnating said porous sintered compact with said molten metal by introducing an impregnating gas into said vessel to apply said predetermined pressure in said vessel.

4. The method for producing said composite material for heat sinks for semiconductor devices according to claim 2, wherein said cooling step comprises the steps of:

inverting said vessel to separate said porous sintered compact after said impregnation from remaining molten metal not subjected to said impregnation; and venting said impregnating gas from said vessel to introduce a cooling gas so that the inside of said vessel is cooled.

5. The method for producing said composite material for heat sinks for semiconductor devices according to claim 2, wherein said cooling step comprises the steps of:

inverting said vessel to separate said porous sintered compact after said impregnation from remaining molten metal not subjected to said impregnation; and allowing said vessel to make contact with a chill block so that inside of said vessel is cooled.

6. The method for producing said composite material for heat sinks for semiconductor devices according to claim 1, wherein said applied pressure is not less than 10 $kgf/cm^2$ and not more than 1000 $kgf/cm^2$.

7. The method for producing said composite material for heat sinks for semiconductor devices according to claim 1, wherein said pressure is applied for a period of time of not less than 1 minute and not more than 30 minutes.

8. The method for producing said composite material for heat sinks for semiconductor devices according to claim 1, wherein said predetermined temperature is a temperature which is higher than a melting point of said metal by 30° C. to 250° C.

9. The method for producing said composite material for heat sinks for semiconductor devices according to claim 1, wherein said cooling step is performed at a cooling rate of not less than −400° C./hour from said temperature during said impregnation to 800° C.

10. The method for producing said composite material for heat sinks for semiconductor devices according to claim 1, wherein a negative pressure state of not more than $1 \times 10^{-3}$ Torr is used prior to applying said predetermined pressure.

11. The method for producing said composite material for heat sinks for semiconductor devices according to claim 1, wherein said porous sintered compact includes pores not less than 90% of which have an average diameter of 0.5 $\mu$m to 50 $\mu$m, having a porosity of 20% by volume to 70% by volume.

12. The method for producing said composite material for heat sinks for semiconductor devices according to claim 1, wherein said porous sintered compact is previously plated with Ni in an amount of 1 to 10% by volume.

13. The method for producing said composite material for heat sinks for semiconductor devices according to claim 1, wherein said porous sintered compact is previously impregnated with 1 to 10% by volume of Si.

14. The method for producing said composite material for heat sinks for semiconductor devices according to claim 1, wherein said impregnating step comprises the steps of:

placing said porous sintered compact and said metal in a negative pressure state or in an ordinary pressure state while making no contact with each other;

heating said porous sintered compact and said metal to sad predetermined temperature at said negative pressure or at said ordinary pressure to melt said metal;

allowing said molten metal to be in a pressure-applied state; and allowing said molten metal at said applied pressure to make contact with said porous sintered compact at said negative pressure or at said ordinary pressure and allowing them to be in a pressure-applied state so tat said porous sintered compact is impregnated with said molten metal at said applied pressure, and wherein:

said cooling step comprises the step of cooling said porous sintered compact impregnated with said molten metal at said applied pressure.

15. The method for producing said composite material for heat sinks for semiconductor devices according to claim 14, wherein both of said porous sintered compact and said molten metal, which are heated while making no contact with each other at said negative pressure or at said ordinary pressure, are placed in said pressure-applied state, and then they are allowed to make contact with each other so that said porous sintered compact is impregnated with said metal.

16. The method for producing said composite material for heat sinks for semiconductor devices according to claim 1, wherein said impregnating step comprises the steps of:

arranging said porous sintered compact and sad metal respectively in two chambers of said vessel comparted to have said two chambers by a porous filter, and sealing said vessel so that said respective chambers are in a negative pressure state or in an ordinary pressure state;

heating both of said two chambers at said negative pressure or at said ordinary pressure to a predetermined temperature so that said metal is melted;

allowing only an upper chamber of said two chambers to be in a pressure-applied state; and allowing said molten metal in said upper chamber at said applied pressure to permeate through said porous filter to a lower chamber so that said molten metal males contact with said porous sintered compact at said negative pressure or at said ordinary pressure, followed by allowing said lower chamber to be in a pressure-applied state so tat said porous sintered compact at said applied pressure is impregnated with said molten metal, and wherein:

said cooling step comprises the step of cooling said porous sintered compact impregnated with said molten metal in said lower chamber in said pressure-applied state.

17. The method for producing said composite material for heat sinks for semiconductor devices according to claim 1, wherein said impregnating step comprises the steps of:

arranging said porous sintered compact and said metal respectively in two chambers of said vessel comparted to have said two chambers by a porous filter, and sealing said vessel so that said respective chambers are in a negative pressure stale or in an ordinary pressure state;

heating both of said two chambers at said negative pressure or at said ordinary pressure to a predetermined temperature so tat said metal is melted;

allowing both of said two chambers to be in a pressure-applied state; and further raising a pressure of an upper chamber of said two chambers to be higher than a pressure of a lower chamber of said two chambers, and allowing said molten metal to permeate through said porous filter to said lower chamber so that said molten metal makes contact with said porous sintered compact, and then said porous sintered compact at said applied pressure is impregnated with said molten metal, and wherein:

said cooling step comprises the step of cooling said porous sintered compact impregnated with said molten metal in said lower chamber at said applied pressure.

18. The method for producing said composite material for heat sinks for semiconductor devices according to claim 14, wherein when said porous sintered compact to serve as said base material is treated and impregnated with said metal containing at least copper, the step of providing said pressure-applied state is performed by means of a press treatment effected in both upward and downward directions, and said cooling step is performed by means of an indirect cooling treatment effected in the vicinity of said lower chamber.

19. A method for producing a composite material for heat sinks for semiconductor devices using a porous sintered compact and molten metal that react with one another, said method comprising:

an impregnating step of allowing said porous sintered compact to serve as a base material to make contact with a metal containing at least copper at a negative pressure or at an ordinary pressure, performing a heating treatment to melt said metal to form a reactive molten metal, and then impregnating said porous sintered compact with said reactive molten metal in a pressure-applied state; and a cooling step of cooling at least said porous sintered compact impregnated with said metal at a cooling rate of at least −480° C./min in order to minimize contact time between said impregnated porous sintered compact and said reactive molten metal.

20. The method for producing said composite material for heat sinks for semiconductor devices according to claim 19, wherein said impregnating step comprises the steps of:

placing said porous sintered compact and said metal in a negative pressure state or in an ordinary pressure state while making contact with each other;

heating said porous sintered compact and said metal to a predetermined temperature at said negative pressure or at said ordinary pressure to melt said metal;

allowing said molten metal to be in a pressure-applied state; and allowing said molten metal at said applied pressure to make contact with said porous sintered compact at said negative pressure or at said ordinary pressure and allowing them to be in a pressure-applied state so that said porous sintered compact is impregnated with said molten metal at said applied pressure, and wherein:

said cooling step comprises the step of cooling said porous sintered compact impregnated with said molten metal at said applied pressure.

* * * * *